(12) United States Patent
Park et al.

(10) Patent No.: US 7,185,295 B2
(45) Date of Patent: Feb. 27, 2007

(54) CHIP DESIGN VERIFYING AND CHIP TESTING APPARATUS AND METHOD

(76) Inventors: Hyunju Park, 173-46 Imun 3-dong, Tongdaemun-gu, Seoul 130-083 (KR); Dong Goo Yun, 604-1008, Gaepo Jugong Apt., 185 Gaepo-dong, Kangnam-gu, Seoul (KR)

(*) Notice: Subject to any disclaimer, the term of this patent is extended or adjusted under 35 U.S.C. 154(b) by 434 days.

(21) Appl. No.: 10/297,120

(22) PCT Filed: Jun. 1, 2001

(86) PCT No.: PCT/KR01/00937

§ 371 (c)(1),
(2), (4) Date: Nov. 17, 2003

(87) PCT Pub. No.: WO01/95238

PCT Pub. Date: Dec. 13, 2001

(65) Prior Publication Data

US 2004/0138845 A1    Jul. 15, 2004

(30) Foreign Application Priority Data

Jun. 3, 2000   (KR) .............................. 2000-30620
Jul. 25, 2000  (KR) .............................. 2000-42575

(51) Int. Cl.
*G06F 17/50* (2006.01)
*G06F 9/45* (2006.01)

(52) U.S. Cl. ............................................. 716/4; 716/5

(58) Field of Classification Search ................. 716/4, 716/5
See application file for complete search history.

(56) References Cited

U.S. PATENT DOCUMENTS 5,535,223 A    7/1996   Horstmann et al.

(Continued)

FOREIGN PATENT DOCUMENTS

JP    59-090067    5/1984

(Continued)

OTHER PUBLICATIONS

International Search Report PCT/KR01/00937; May 17, 2002.

(Continued)

*Primary Examiner*—Thuan Do
*Assistant Examiner*—Magid Y. Dimyan
(74) *Attorney, Agent, or Firm*—Cantor Colburn LLP

(57) ABSTRACT

A chip design verifying and chip testing apparatus is provided including a storing means for storing an application program verifying an operation of a chip and testing the chip, the chip having a plurality of blocks, an I/O file, and a test vector; an interface means controlling a data transmission between the storing means and the chip, the interface means having a data applying means for applying the I/O file and/or the test vector outputted from the storing means and a data storing means for storing data outputted from the chip; and a computer including a CPU for performing and controlling the application program.

24 Claims, 32 Drawing Sheets

U.S. PATENT DOCUMENTS

| | | |
|---|---|---|
| 5,613,102 A | 3/1997 | Chiang et al. |
| 5,650,938 A | 7/1997 | Bootehsaz et al. |
| 6,016,563 A | 1/2000 | Fleisher |
| 6,067,652 A * | 5/2000 | Fusco et al. ............... 714/741 |
| 6,205,407 B1 * | 3/2001 | Testa et al. ............... 702/119 |
| 6,678,645 B1 * | 1/2004 | Rajsuman et al. ........... 703/20 |
| 6,704,895 B1 * | 3/2004 | Swoboda et al. .......... 714/726 |

FOREIGN PATENT DOCUMENTS

| | | |
|---|---|---|
| JP | 61-056984 | 3/1986 |
| JP | 04-019579 | 1/1992 |
| JP | 05-150009 | 6/1993 |
| JP | 07-140211 | 6/1995 |
| JP | 07-167922 | 7/1995 |
| JP | 08-136614 | 5/1996 |
| JP | 11-083946 | 3/1999 |
| JP | 2000-065904 | 3/2000 |

OTHER PUBLICATIONS

International Preliminary Examination Report; PCT/KR01/00937; Sep. 13, 2002.

* cited by examiner

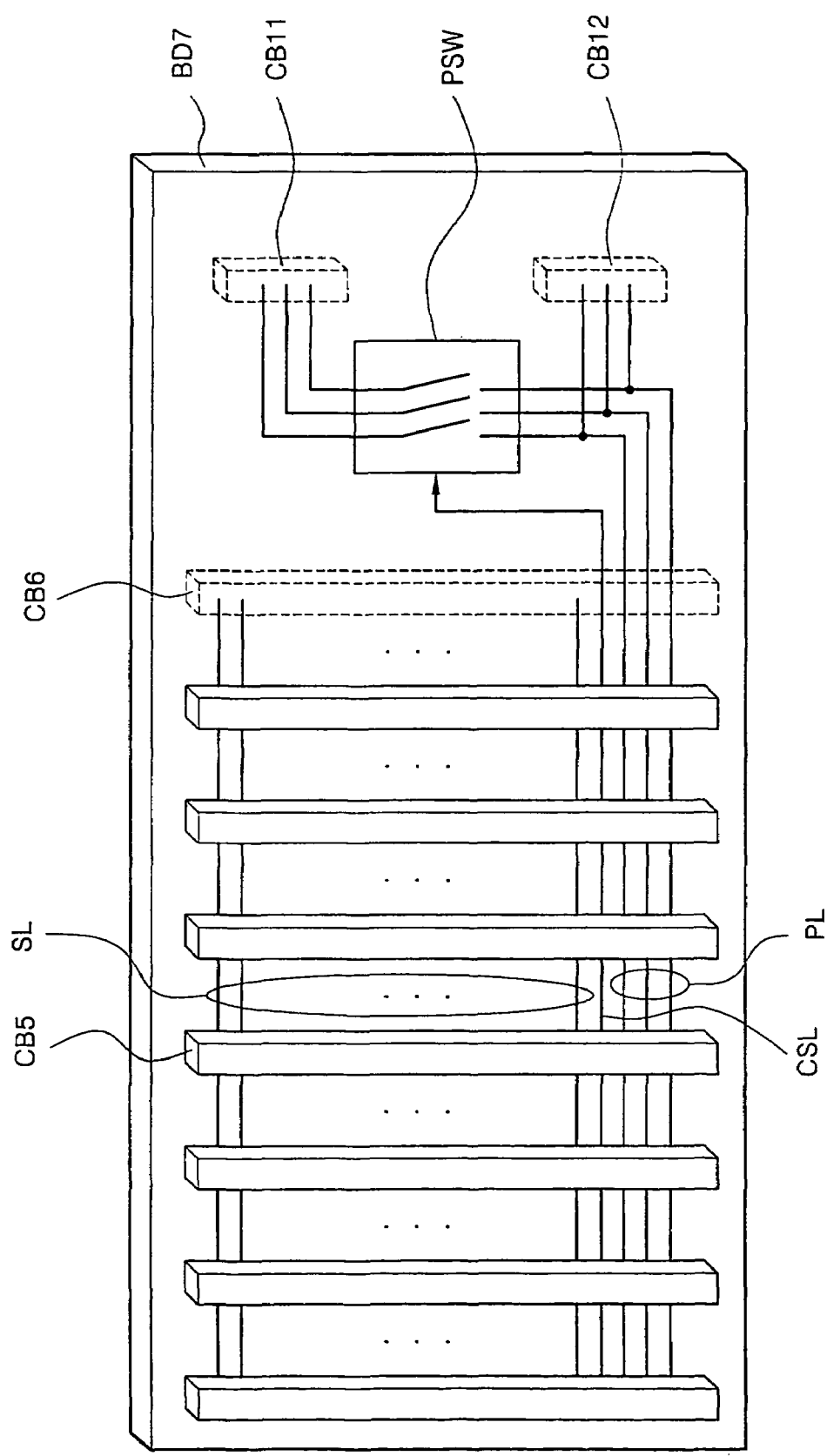

FIG.10

| Symbol of logic state(code) | meaning |
|---|---|
| 0(000) | input low |
| 1(001) | input high |
| L(010) | output low |
| H(011) | output high |
| S(100) | week low |
| T(101) | week high |
| Z(110) | tri-state |
| X(111) | unknown |

FIG.12

| signal name | A | B | C | D | E | F | G | H | I | J | K | L | M | N | O | P | Q | R | S | T |
|---|---|---|---|---|---|---|---|---|---|---|---|---|---|---|---|---|---|---|---|---|
| input data according to a variation of a time (t) | H | H | H | H | H | L | L | 0 | 0 | 0 | 1 | 1 | 0 | 1 | 1 | 1 | 1 | 1 | X | X |
| | H | H | L | L | Z | Z | Z | 0 | 0 | 0 | 1 | 1 | 0 | 1 | 1 | 0 | 1 | 1 | X | X |
| | H | H | L | L | Z | Z | Z | 0 | 0 | 0 | 1 | 1 | 0 | 1 | 1 | 0 | 1 | 1 | X | X |
| | H | H | L | L | Z | Z | Z | 0 | 0 | 0 | 0 | 0 | 0 | 1 | 1 | 0 | 1 | 1 | X | X |

FIG.13

| logic state and run of input data | compressed input data |
|---|---|
| H(5) L(2) 0(3) 1(2) 0(1) 1(5) X(2) | 1_011_011_101, 1_010_010_10, 1_010_000_11, 1_010_001,10 1_001_000_1, 1_011-001_101, 1_010_111_10 |
| o(2) 0(2) 1(3) o(8) 0(1) o(4) | 0_010_0_10, 0_010_1_10,1_010_110_11,0_100_0_1000 0_001_1_1, 0_011_0_100 |
| 0 | 0 |
| o(10) 0(2) o(8) | 0_100_0_1010, 0_010_1_10, 0_100_0_100 |
| ... | ... |

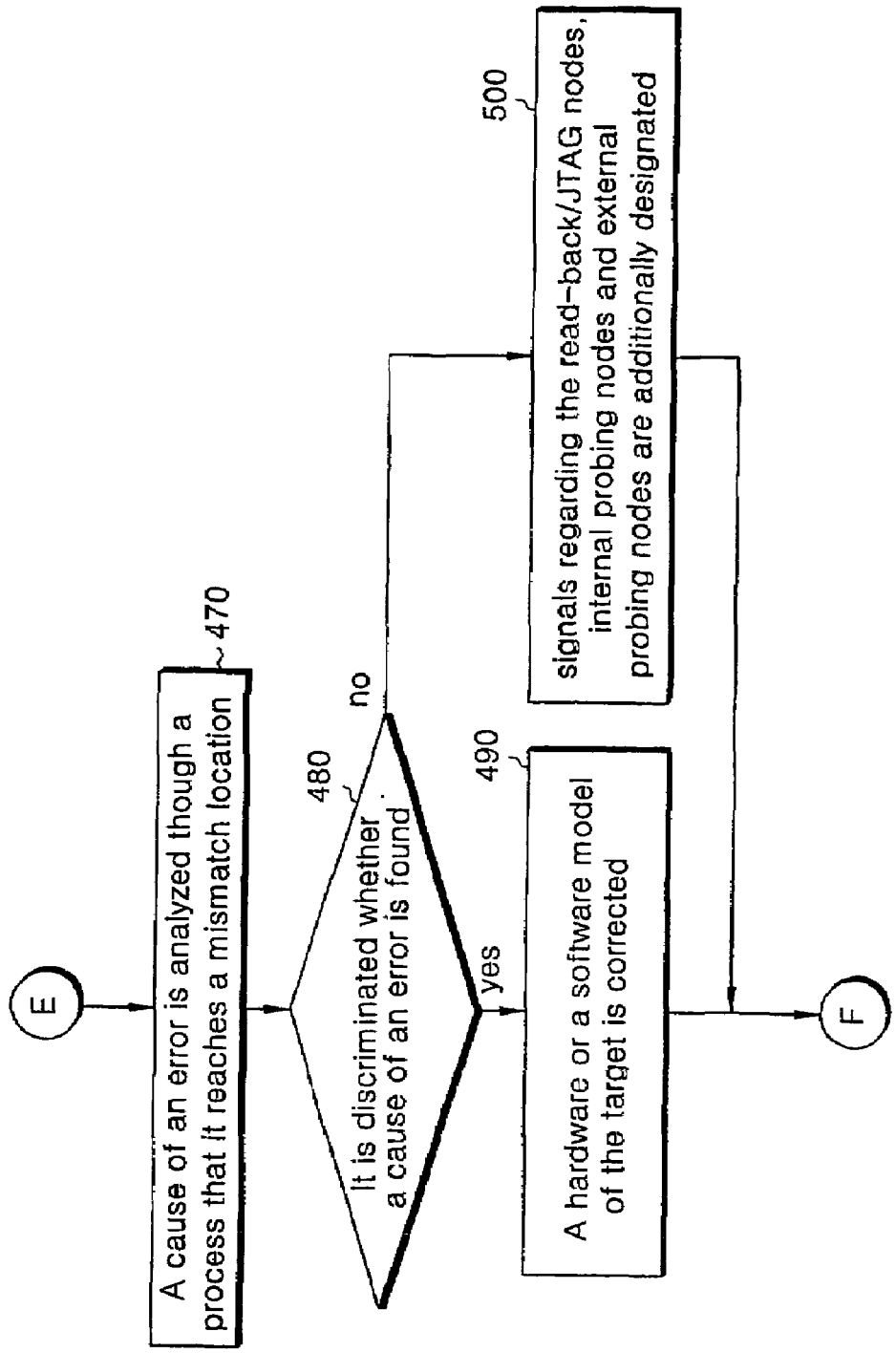

CHIP DESIGN VERIFYING AND CHIP TESTING APPARATUS AND METHOD

BACKGROUND OF THE INVENTION

1. Field of the Invention

The present invention relates to a chip design verifying and chip testing apparatus and method.

2. Description of Related Art

As electronic design automation (EDA) tools, which relates to a design automation and a design technique utilizing a hardware description language (HDL), are widely used in various electronic industrial fields, a design circumstance of an application specific integrated circuit (ASIC) has become greatly improved. For example, compared with the existing circuits having a capacity of from tens of thousands to hundreds of thousands of gates, recently circuits have been designed to have a capacity of millions of gates, and thus the ASIC design circumstance is improved enough to embody a system on a chip (SOC).

To embody such a circuit having a large-sized capacity on one ASIC element becomes possible due to a submicronized semiconductor process. As a semiconductor process becomes more submicronized, the ASIC element shows a tendency of a higher integration and a higher speed. In embodying a large-sized and complicated circuit on the ASIC element, one of the most troublesome cores relates to a verification of a proper operation of the designed circuit during a simulation and a system operation.

Since a circuit designer can estimate what the output results are for given inputs, a simulation is just a procedure confirming such a simple function without covering corner cases. When the designed circuit is mounted on a system board, the circuit on the system always does not generate inputs of the same form as inputs that are used to run a simulation for the function of the designed circuit. This is one of the greatest causes of the ASIC failure occurred when a simulation is sufficiently not performed.

As a circuit to be designed becomes complicated, and an intellectual property (IP) blocks to be recycled becomes increased in number, it becomes more difficult to make out a pattern of a simulation that can perfectly perform an operation of a chip on a system. Particularly, in case of a circuit having millions of gates, it requires much time to perform a simulation that is operated by a command language of a microprocessor.

In order to overcome the problems occurred during a simulation by using a hardware method other than a software method, a field programmable gate array (FPGA) that is re-programmable is widely used as a debugging means. As another solution for the problems, an ASIC verifier having a more effective debugging means and based on such an FPGA has been used. The FPGA is a device that a user runs a compile by using the user designed circuit as a compile input for the FPGA and downloads the result bit stream file to the FPGA, so that the user designed circuit is formed in the FPGA in the form of a hardware. The FPGA is generally used to effectively verify a relatively small-sized circuit, and thus an ASIC verifier of a high performance is required to effectively verify a relatively large-sized circuit.

As an example of a conventional chip design verifying apparatus, a computer built-in chip design verifier is disclosed in U.S. Pat. No. 6,009,256. The computer built-in chip design verifier includes a process for processing a software model of a chip to be designed in the computer and a re-configurable hardware board for embodying a hardware model to embody a chip and verifies an operation of an embodied chip. The computer built-in chip design verifier can organically be operated by connecting a target to which the designed chip will be applied to an external portion of the computer. However, as described above, the computer built-in chip design verifier includes a hardware board constructed with a field programmable gate array to embody a hardware model of the designed chip. Therefore, since it does not use a data compression method for a data transmission between a main memory of and a hardware board of a computer, a performance improvement is limited. In addition, as a hardware configuration of a circuit becomes complicated, a large number of hardware boards should be provided. Moreover, the computer built-in chip design verifier verifies an operation of a chip designed at a chip designing step but does not provide a function for testing an operation of the manufactured chip.

As another example of a conventional chip design verifier, a computer stand-alone chip design verifier is disclosed in U.S. Pat. No. 5,963,735. The computer stand-alone chip design verifier includes an emulator, a VLSI apparatus and a memory, outside a computer. The hardware emulator includes a configuration circuit, a logic analyzer/pattern generator, field programmable gate arrays, and an interface circuit. A design circuit and an application program are arranged in the computer. In order to embody a function of a circuit to be verified by performing a series of processing steps and a compile through an application program, bit stream files corresponding to each of the field programmable gate array are produced to respectively be written on the field programmable gate arrays. The user can control the hardware emulator using a software environment of an application program. The computer stand-alone chip design verifier includes field programmable gate arrays in order to embody a hardware model of a design to be verified.

As a graphic-related application example, the computer stand-alone chip design verifier should include an interface circuit or a separate interface circuit for an interface between the hardware emulator and a monitor for a screen output. In other words, since signals from the hardware emulator are outputted at a low speed, in case of directly displaying the signals on the monitor, a normal screen may be not outputted. Therefore, the interface circuit should be provided between the hardware emulator and the monitor to output a normal screen.

As described above, the conventional chip design verifiers have a problem in that a suitable hardware verifying environment should be provided additionally. That is, in case of a graphic-related design, additional graphic data buffering apparatus and a monitor to output a screen should be provided to monitor a screen output. Moreover, even though the conventional chip design verifiers can verify an operation of the designed chip, there comes a problem that it can not test an operation of the manufactured chip. Besides, the conventional chip design verifiers include standard means in themselves that can contain a design to be verified and focus on how to offer the results of the design to be verified to the standard means in a desirable manner, whereas they can not provide a proper window environment for an universal verification regarding how to effectively verify a design to be verified that is constructed with various functional blocks, according to each of the functional blocks, and how to effectively perform a debugging and to easily find errors.

SUMMARY OF THE INVENTION

The present invention provides a chip design verifying and chip testing apparatus that can be used both as a verifier to verify an operation of a designed chip and as a tester to test an operation of a manufactured chip.

The present invention further provides a chip design verifying and chip testing apparatus that can easily detect errors.

According to one aspect of the present invention, a chip design verifying and chip testing apparatus comprises a storing means for storing an application program verifying an operation of a chip and testing the chip, the chip having a plurality of blocks, an I/O file, and a test vector, an interface means controlling a data transmission between the storing means and the chip, the interface means including a data applying means for applying the I/O file and/or the test vector outputted from the storing means and a data storing means for storing data outputted from the chip, a computer including a CPU for performing and controlling the application program.

When the application program is executed, a graphic user interface is displayed on a monitor of the computer, and a verifying mode or a testing mode is set through the graphic user interface, and results corresponding to the plurality of the blocks are displayed on corresponding windows.

According to another aspect of the present invention, a chip design verifying and chip testing method includes: providing a computer including a storing means, the storing means storing an application program for verifying a chip and testing the chip, the chip having a plurality of blocks, an I/O file, and a test vector; executing the application program to display a graphic user interface on a monitor of the computer; storing data constituting the IO file and/or the test vector stored in the storing means in a data applying means when an operating mode is set to a verification mode to verify an operation of the designed chip through the graphic user interface; storing data outputted from the chip in the data storing means; storing data constituting the test vector stored in the storing means in the data applying means when the operating mode of the chip is set to a test mode to test the manufactured chip through the graphic user interface; and storing data outputted from the chip in the data storing means while applying data constituting the test vector stored in the data applying means to the chip.

This application claims the benefit of Korean Patent Application No. 2000-30625, filed on Jun. 3, 2000 and the benefit of Korean Patent Application No. 2000-42575, filed on Jul. 25, 2000, under 35 U.S.C. § 119, the entirety of which are hereby incorporated by reference.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 6f is an embodiment of a back board of the module according to the preferred embodiment of the present invention;

FIG. 10 is a table showing a relationship between a symbol representing a logic state and a meaning of the symbol;

FIG. 12 shows an embodiment of a test vector stored in a hard disk;

FIG. 13 shows input and output data of the test vector that are compressed in the data format of FIG. 11, and a logic state of and a run of the input data of FIG. 12;

FIGS. 14a to 14c are a flow chart illustrating a chip design verifying method by the inventive chip design verifying and chip testing apparatus;

DETAILED DESCRIPTION OF PREFFERED EMBODIMENTS

Figure 1:
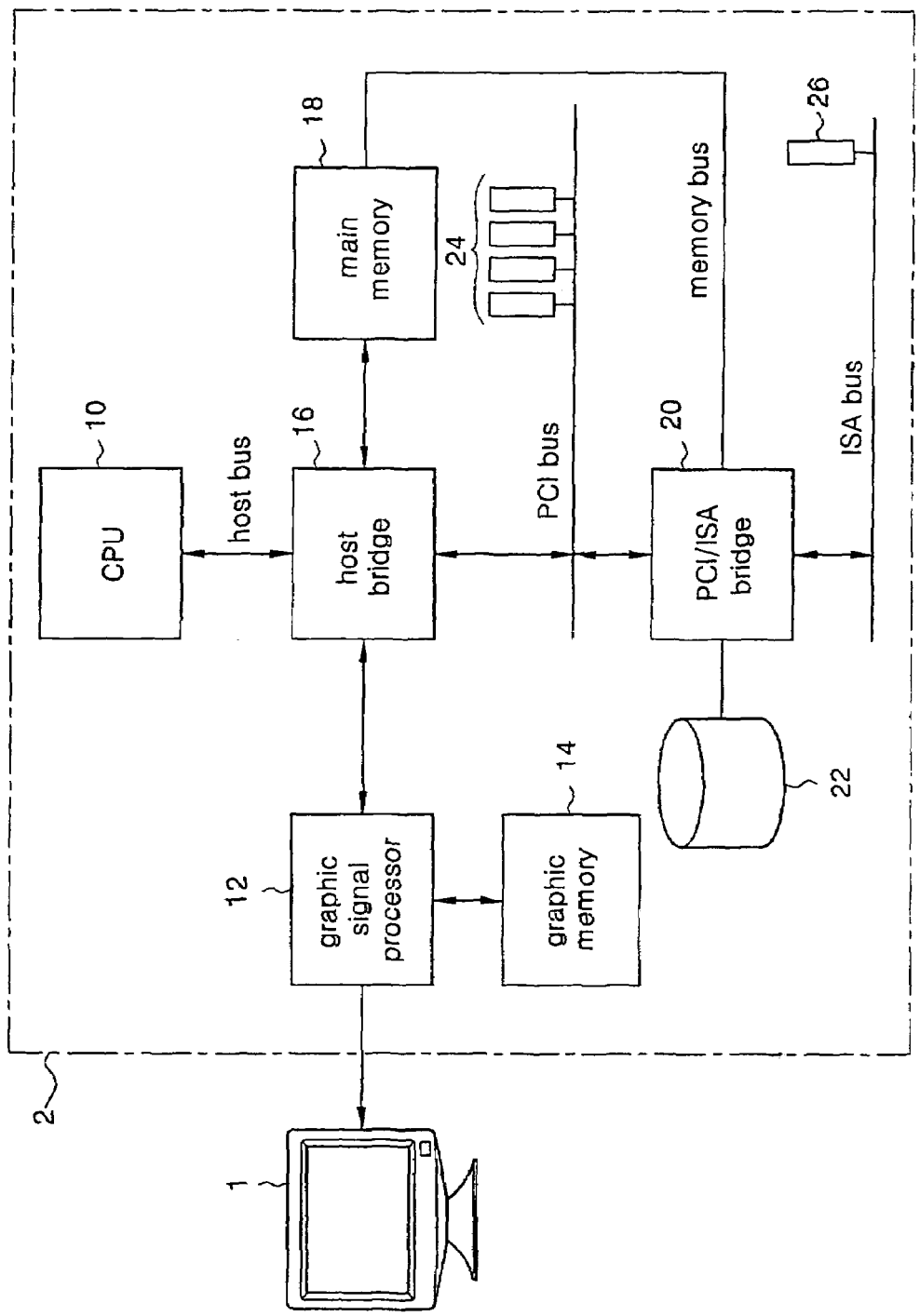
FIG. 1 is a block diagram illustrating a configuration of a typical computer system.

Reference will now be made in detail to a preferred embodiment of the present invention, example of which is illustrated in the accompanying drawings.

Returning now to FIG. 1, which shows a configuration of a typical computer system, the computer system includes a monitor 1 and a computer mainframe 2. The computer mainframe 2 includes a central processing unit (CPU) 10, a graphic signal processor 12, a graphic memory 14, a host bridge 16, a main memory 18, a PCI/ISA bridge 20, a hard disk drive 22, PCI slots 24, and an ISA slot 26.

The CPU 10 executes an application program and performs a function to control the computer system. The host bridge 16 performs an interface function among the CPU 10, the main memory 18, the graphic signal processor 12, the PCI/ISA bridge 20, and the PCI slots 24. The main memory 18 stores application programs and various kinds of input/output data that the CPU 10 brings from the hard disk 22. The graphic signal processor 12 is connected with the graphic memory 14, so that graphic-related signals transmitted from the main memory 18 are stored in the graphic memory 14. The graphic signal processor 12 processes the graphic-related signals to be displayed on the monitor 1. The PCI slots 24 are connected with the PCI bus to transmit data and include LAN card slots, faxmodem slots, etc., for, respectively, accepting LAN interface cards, faxmodem card, etc. The PCI/ISA bridge 20 performs an interface function among the host bridge 16, the main memory 18, the hard disk 22, the PCI bridge 24, and the ISA slot 26. The hard disk 22 stores application programs and various kinds of data. The ISA slots 26 are connected with the ISA bus to transmit data. In FIG. 1, even though four PCI slots 24 and one ISA slot 26 are arranged, the number of the PCI slots 24 and the ISA slots 26 is not limited to the present invention.

Figure 2:
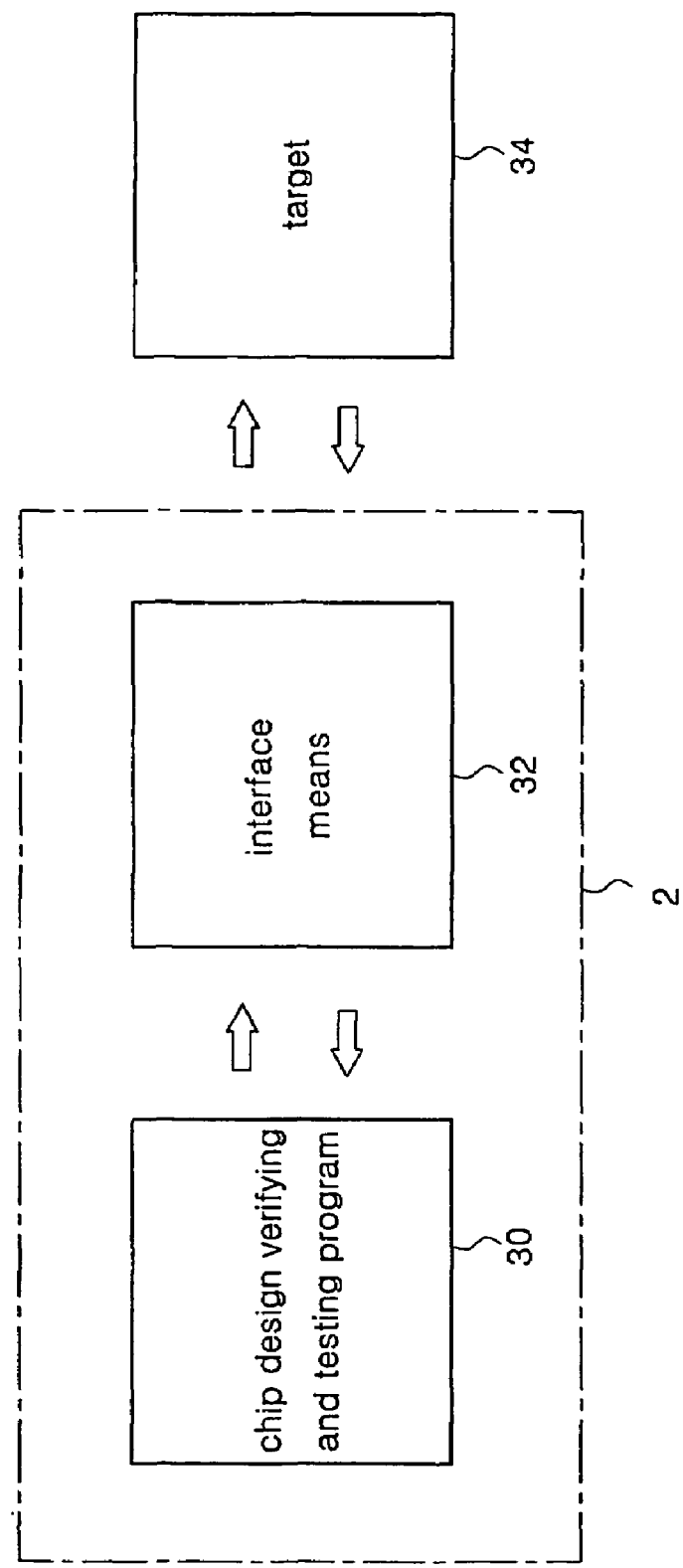
FIG. 2 is a block diagram illustrating a chip design verifying and chip testing apparatus according to the preferred embodiment of the present invention

FIG. 2 is a block diagram illustrating chip design verifying and chip testing apparatus according to the preferred embodiment of the present invention. As shown in FIG. 2, the chip design verifying and chip testing apparatus includes the mainframe 2 that has a chip design verifying and chip testing program 30 and an interface means 32, and a target 34. That is, the chip design verifying and chip testing apparatus is constructed in such a way that the chip design verifying and chip testing program 30 is stored in the hard disk 22 of the mainframe 2 of the computer system of FIG. 1, and the interface means 32 is accepted in the PCI slots 24 that is connected to the PCI bus.

Figure 3A:
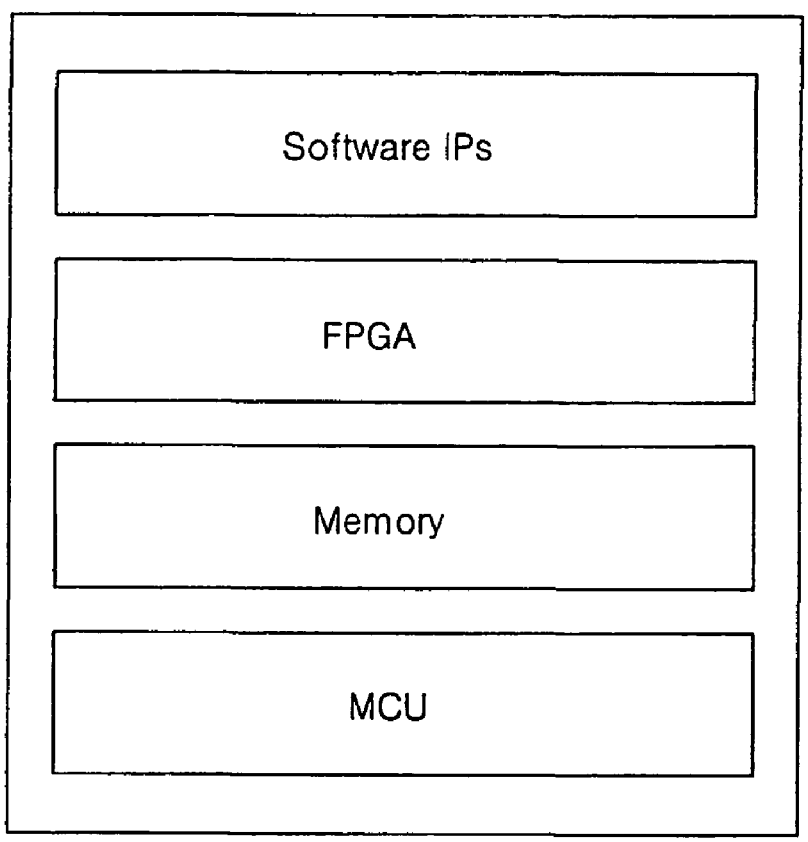
FIG. 3a shows an embodiment of a target.

FIG. 3*a* shows an embodiment of the target. The target of FIG. 3*a* includes software intellectual property (IP), a FPGA, a memory, and a micro controller unit (MCU). The software IP is embodied using the memory and the micro controller unit or a corresponding hardware IP. The FPGA stands for a field programmable gate array and is a hardware model for embodying the hardware portion of the user designed chip. The memory and the MCU are embodied using a universal chip. That is, the target 34 of FIG. 3*a* is one which embodies the software IP, the hardware IP that is an universal chip, the memory, the micro-controller unit, and the FPGA embodying the hardware portion non-embeddable by the universal chip.

Figure 3B:
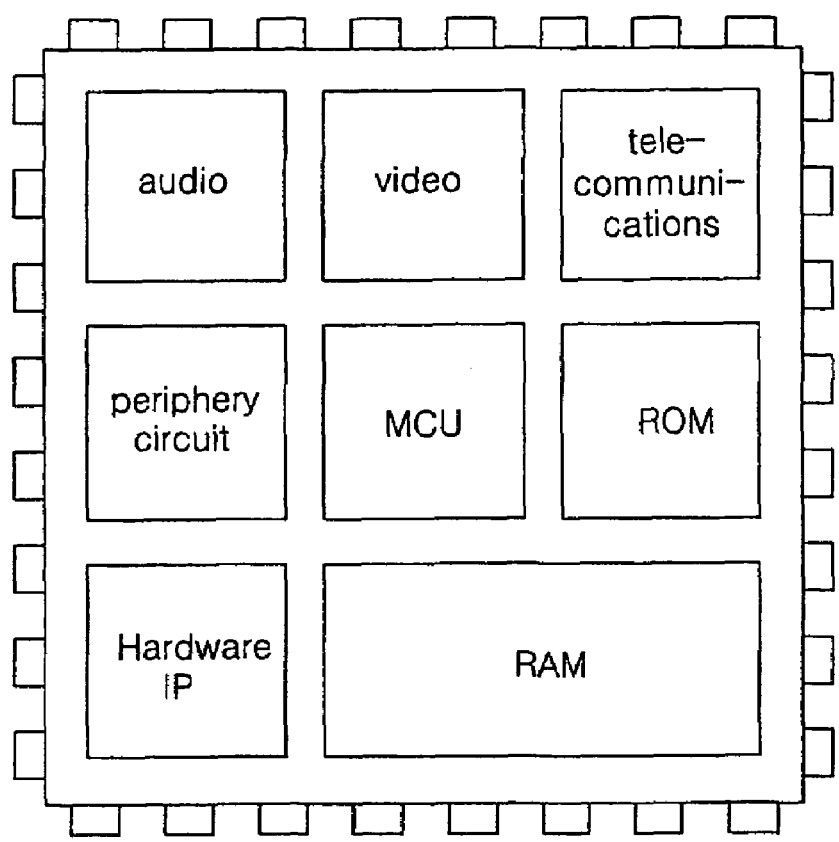
FIG. 3b shows another embodiment of the target.

FIG. 3*b* shows another embodiment of the target. The target of FIG. 3*b* includes an audio, a video, a telecommunications, a periphery circuit, an MCU, a read only memory (ROM), a random access memory (RAM), and a hardware IP. The target of FIG. 3*b* is manufactured by a customer order. The audio, the video, the telecommunications, and the periphery circuit are blocks corresponding to the FPGA of FIG. 3*a*. The ROM and the RAM are blocks corresponding to the memory of FIG. 3A. The hardware IP is a block corresponding to the software IP.

The target 34 is not limited to a certain target. As shown in FIGS. 3*a* and 3*b*, the target 34 may be a designed chip that is deconstructed by the universal chip and the field programmable gate array. Or, a hardware emulator may be used as the target 34. After a chip is manufactured, the target 34 may be a manufactured chip of FIG. 3*b*.

Figure 4:
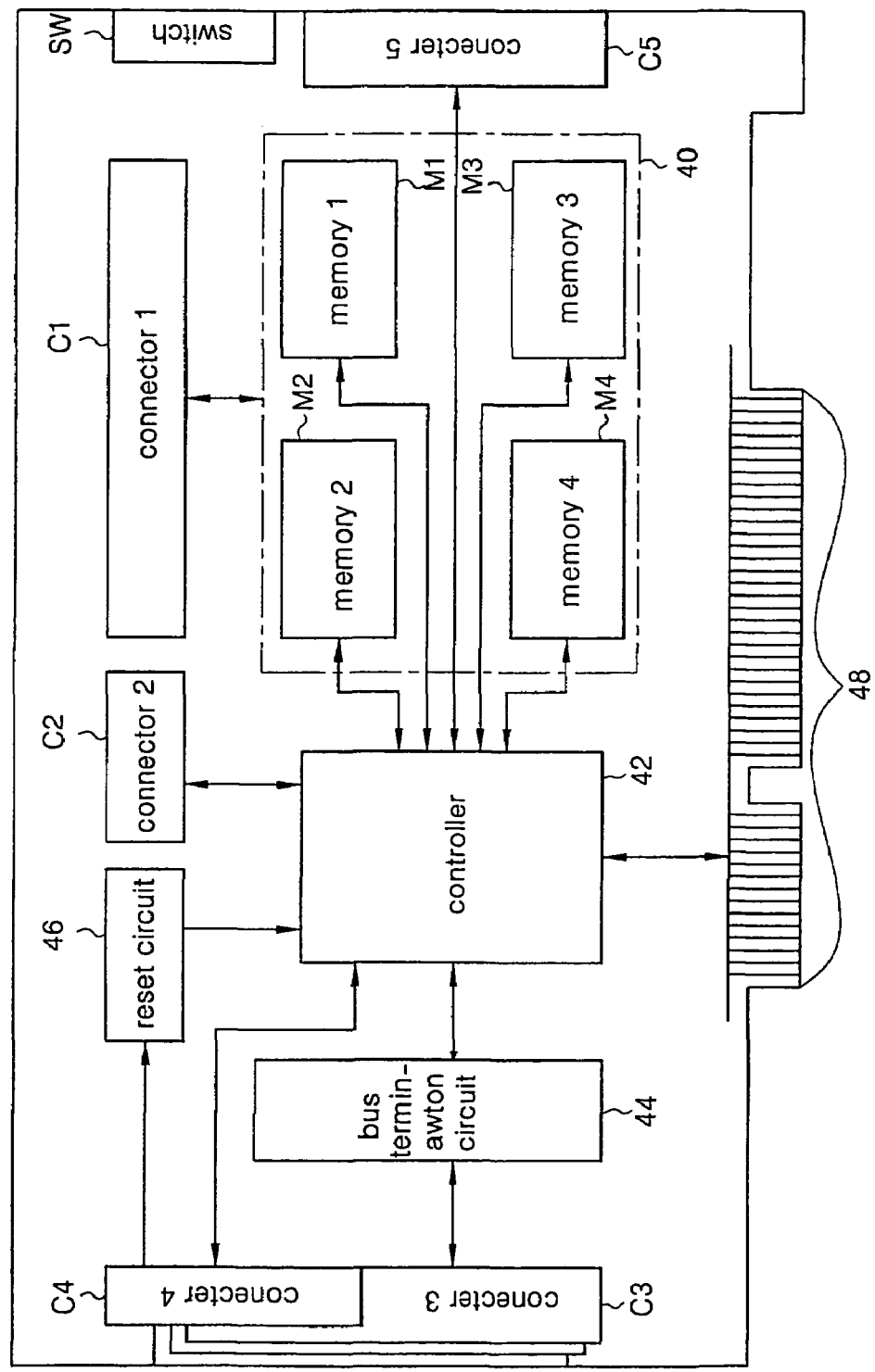
FIG. 4 is a block diagram illustrating an embodiment of an interface means of the chip design verifying and chip testing apparatus.

FIG. 4 is a block diagram illustrating an embodiment of the interface means of the chip design verifying and chip testing apparatus. The interface means 32 includes first to fifth connectors C1 to C5, a memory 40 having first and fourth memories M1 to M4, a controller 42, a bus termination circuit 44, a reset circuit 46, and a switch SW. The interface means of FIG. 4 is one that shows a configuration of the interface board and is inserted into the PCI slots 24 of the mainframe 2 of FIG. 4 through a connecting portion 48.

The first connector C1 is connected to the memory 40 to input/output signals and is used to expand a memory capacity by being connected with either a memory board thereto or a memory of a neighboring interface means 32. The connector C2 is used to connect the interface means 32 with each other when a plurality of the interface means 32 are inserted into the PCI slots 24. The third connector C3 is connected with the target 34 via, for example, a connection cable according to a pin to signal mapping of an application program. The third connector C3 is arranged on a front surface of the mainframe 2 because a front surface of the mainframe 2 is larger in space than a back surface. The fourth and fifth connectors C4 and C5 are used to connect a standard signal inputted from an external clock generator or the target 34, a clock signal transmitted from the interface means 32 to the target 34, or a control signal transmitted from the interface means 32 to the an external pulse generator (not shown). Preferably, the fourth connector C4 is arranged on a front surface of the mainframe 2, and the fifth connector C5 is arranged on a back surface of the mainframe 2. The fourth and fifth connectors C4 and C5 are used to connect various kinds of signals between the controller 42 of the interface means 32 and the target 34 or between the controller 42 and an external measuring instrument (not shown) such as a function generator (i.e., a frequency generator). Of four memories M1 to M4 of the memory 40, the two stores data received from the main memory 18 and outputs the stored data to the target 34, and the other two stores data outputted from the target 34 and outputs the stored data to the main memory 18. The reset circuit 46 generates a reset signal by an operation of an external reset switch (not shown). The bus termination circuit 44 buffers data outputted from the controller 42 to be applied to the third connector C3 during a data outputting operation and buffers data applied from the third connector C3 to be applied to the controller 42 during a data inputting operation. The switch SW includes a DIP switch to set an identification number of a certain interface means 32 when a plurality of the interface means 32 are accepted in the PCI slots 24. The controller 42 controls a data transmission from the main memory 18 to the memory 40, from the memory 40 to the target 34, from the target 34 to the memory 40, and from the memory 40 to the main memory 18.

Figure 5:
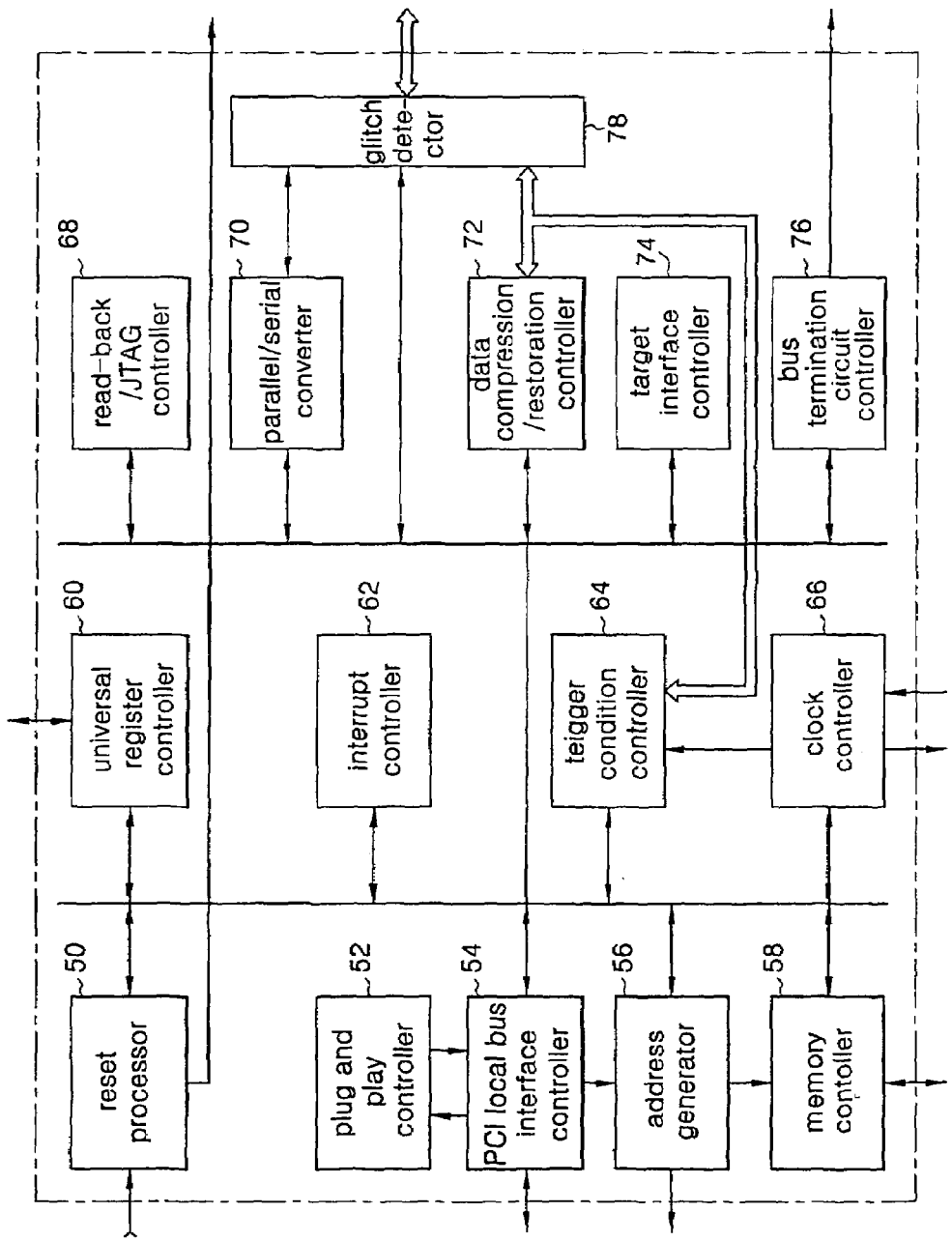
FIG. 5 is a block diagram illustrating a controller of FIG. 4.

FIG. 5 is a block diagram illustrating the controller of FIG. 4. The controller 42 includes a reset processor 50, a plug and play controller 52, a PCL local bus interface controller 54, an address generator 56, a memory controller 58, a universal register controller 60, an interrupt controller 62, a trigger condition controller 64, a clock controller 66, a read-back/JTAG controller 68, a parallel/serial converter 70, a data compression/restoration controller 72, a target interface controller 74, a bus termination circuit controller 76, and a glitch detector 78.

The reset processor 50 performs an initialization operation of internal registers of the controller 42. A reset signal is applied by one of an external reset switch, a chip design verifying and chip testing program, and the PCI bus system, or by a normal termination of an operation when the last frame is completely transmitted. The plug and play controller 52 controls various kinds of PCI configuration registers (not shown) for a plug and play operation. The PCI local bus interface controller 54 is connected directly with various kinds of PCI-related signals and performs an interface control between the main memory 18 and the memory 40 of the interface means 32 via the PCI bus. The address generator 56 generates an address for the memory 40 of the interface means 32 during a data transmission between the main memory 18 and the memory 40 of the interface means 32 or between the memory 40 of the interface means 32 and the target 34. The memory controller 58 directly accesses the memory 40 of the interface means 32 according to a control signal of the PCI local bus interface controller 54 and the target interface controller 74 to perform a data transmission operation. The universal register controller 60 checks various kinds of states of the interface means 32 that may occur according to a data transmission operation and stores the result in the universal register therein. The interrupt controller 62 controls an interrupt generation to ask a data transmission between the main memory 18 and the memory 40 of the interface means 32. The trigger condition controller 64 is operated by a high sampling frequency to embody a logic analyzer. Also, by using various kinds of graphic user interfaces (GUI) that is displayed on a screen by executing a chip design verifying and chip testing program, the trigger condition controller 64 detects a location consistent with a trigger condition when the trigger condition which a user sets for a certain I/O data received/outputted through the data compression/restoration controller 72 is received while monitoring input and output signals of the target 34 in real time. Also, the trigger condition controller 64 can set input or output frame step number or the clock step number which a user sets through the GUI as a trigger condition. When the input or output frame step number is set as a trigger condition, a trigger operation is performed at a position where the input or output frame number that is counted in a process for processing input/output data of the data compression/restoration controller 72 is consistent with the input or output frame step number set as a trigger condition. In the same way, when the clock step number is set as a trigger condition, a trigger operation is performed at a position where, of clock signals generated from the clock controller 66, a counting result of a clock signal set as a trigger condition is consist with the clock step number set as a trigger condition. The trigger condition is applied individually or sequentially by a priority. When a trigger location is detected using the method described above, the trigger condition controller 64 stores informations regarding a start address, a memory region of the start address, an end address, and a memory region of the end address for a screen display from an address and memory region information at a trigger position that is outputted from the address generator 56 and the memory controller 58 to the universal register controller 60 and transfers an interrupt request signal that represents a data transmission of a display corresponding memory region to the interrupt controller 62. The clock controller 66 receives clock signals from the PCI bus, the external clock generator, the target, and so on to generate internal and external clock signals of the interface means 32. Also, the clock controller 66 has a built-in phase-locked loop (PLL) circuit for generating a high-speed sampling clock signal, which is used in a clock divider circuit and a logic analyzer. The read-back/JTAG controller 68 reads values for internal nodes or registers of the FPGA and the MCU that constitute the target 34 and other elements supporting a read-back/JTAG. JTAG is based on IEEE 1149.1. The read-back/JTAG controller 68 receives informations such as a user-set location information of the internal nodes or registers of the elements in which a read-back/JTAG will be performed, and the number of a clock step to perform a continuous operation and then controls a generation of and a storage of a read-back/JTAG input and output signals of the corresponding elements based on the informations. The parallel/serial converter 70 converts a serial data to a parallel data or a parallel data to a serial data. The data compression/restoration controller 72 performs a restoration operation when compressed data stored in the memory 40 of the interface means 32 are applied to the target 34 and performs a compression operation when normal data from the target 34 are applied to the interface means 32. The target interface controller 74 controls an interface for data input and output operations of the target 34. The bus termination circuit controller 76 receives a result of a pin to signal allocation of the chip design verifying and chip testing program to perform a control as to whether the target 34 is connected to the controller 42 or not, and makes the bus termination circuit 44 not to transmit data between the third connector C3 and the bus termination circuit 44. The glitch detector 78 detects a glitch element contained in data from the target 34 and stores the clock number at a position where the glitch element is detected or an address of the memory 40 of the interface means 32 in a separate register or the memory 40 in order to display a location of the glitch element on a screen.

The interface means 32 described above performs both a signal application to the target 34 and a storage of a signal applied from the target 34. However, the interface means 32 may be used to perform only one of the two functions.

It can be set what usage of the interface means 32 has by using the graphic user interface displayed by performing the chip design verifying and chip testing program. For example, when three interface means 32 are inserted into the PCI slots 24, a use of the interface means 32 is set in such a way that the first interface means is used for a signal application (or pattern generator), the second interface means is used for a signal storage (or logic analyzer), and the third interface means is used for a signal application and storage (or a pattern generator and a logic analyzer). An identification number is provided to each of a plurality of the interface means by manipulating the DIP switch SW of the interface means 32, and a usage of a plurality of the interface means 32 can, respectively, be set on the graphic user interface using this identification number.

When the controller 42 of the interface means 32 of FIG. 4 is configured in FPGA and the interface means 32 is to be used for a part of the target 34, some blocks of the target as shown in FIGS. 3a and 3b can be configured in FPGA of the interface means 32. So, the interface means 32 may be used as a target. That is, by configuring the controller 42 in FPGA, when the interface means 32 is used as a target, some configurable blocks of FIGS. 3a and 3b may be configured in the FPGA, and the memory blocks may be implemented using the memory 40 of the interface means 32 having a relatively large capacity.

Figure 6A:
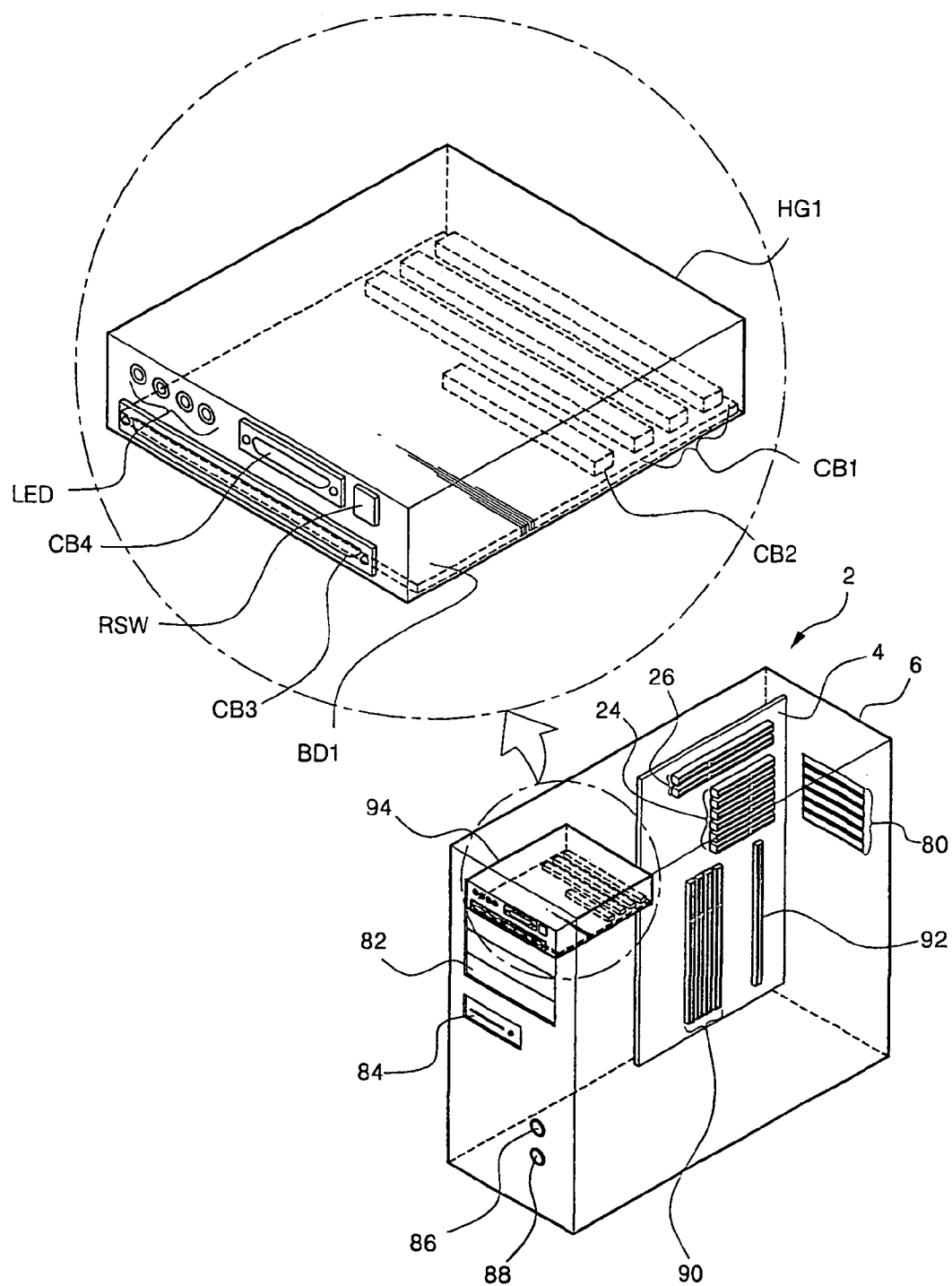
FIG. 6a shows an embodiment of a module for a connection between the interface means and the target.

FIG. 6a shows an embodiment of a module for a connection between the interface means and the target. As shown in FIG. 6a, the computer mainframe 2 includes a mainframe case 6. A front surface of the mainframe case 6 includes a portion 82 where the CD ROM drive and the hard disk drive are mounted and a portion 84 where a floppy disk drive is mounted. A back surface of the mainframe 6 includes slot ports 80. A main board 4 is arranged in the mainframe 2 and includes a CPU slot 92, memory slots 90, the PCI slots 24, and the ISA slots 24.

The module 94 is mounted on the location 82 where a CD ROM drive and the hard disk drive of the mainframe 2 are mounted. The module 94 includes a housing HG1, a board BD1, module connectors CB1 to CB4, a reset switch RSW, and an LED indicator LED.

The third and fourth connectors C3 and C4 of the interface means 32 of FIG. 4 are connected with the first and second module connectors CB1 and CB2 of the module 94, respectively, through, for example, a cable (not shown). The first module connector CB1 of the module 94 is connected with the third module connector CB3 through signal lines on the board BD1, and the third module connector CB3 of the module 94 is connected with the target 34 through, for example, a cable (not shown). The reset switch SW is connected with the second module connector CB2 through signal lines on the board BD1. The LED indicator LED is an indicator that indicates a state of the module 94. The mainframe 2 can be easily connected with the target 34 through the module 94 of FIG. 6a.

Figure 6B:
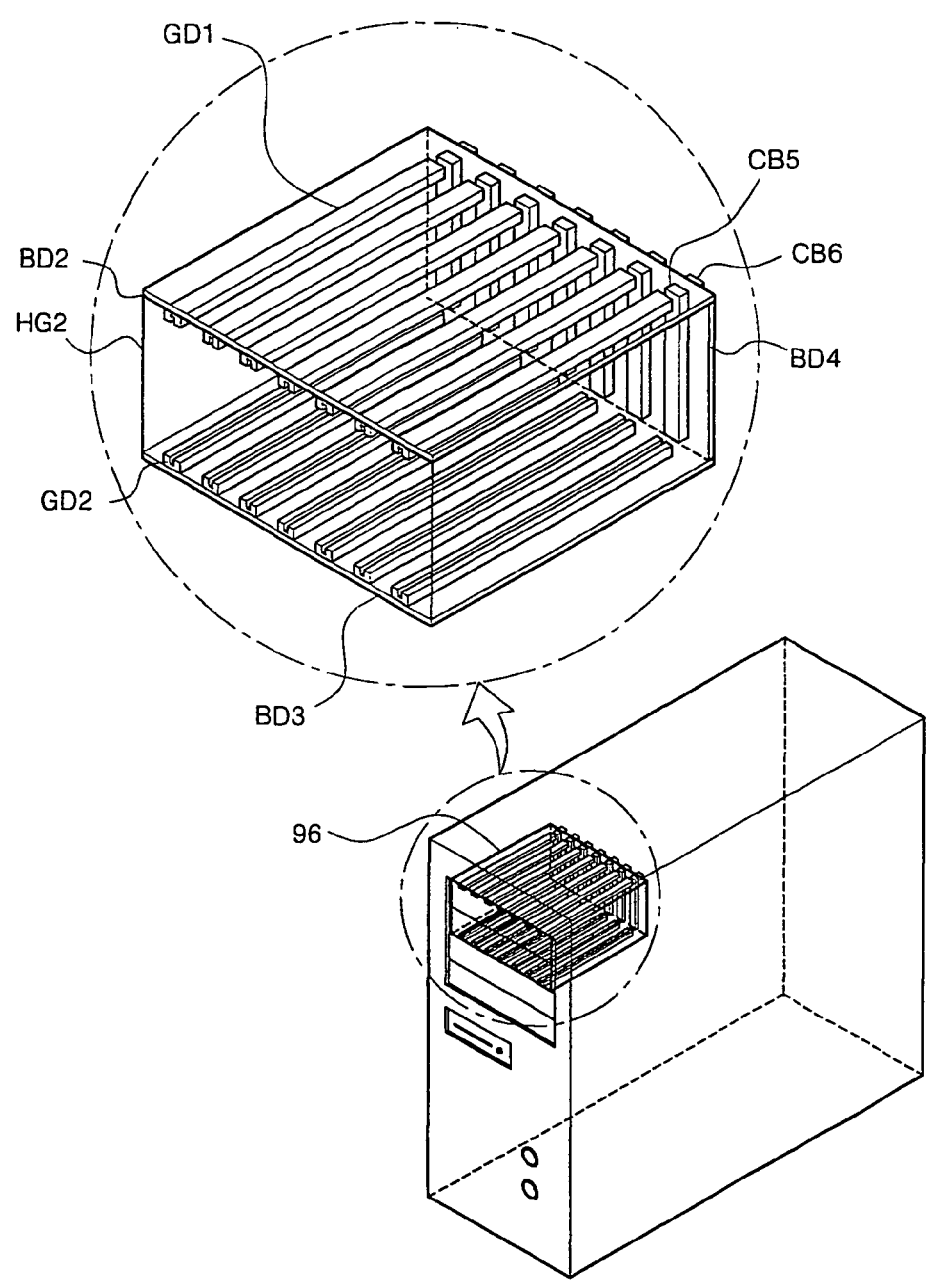
FIG. 6b shows another embodiment of a module for a connection between the mainframe and the target.

FIG. 6b shows another embodiment of a module for a connection between the mainframe and the target. As shown in FIG. 6b, the module 96 is mounted on a portion 82 where the CD ROM drive and the hard disk drive are mounted. Even though the module 96 of FIG. 6b is mounted on a space where two CD ROM drives are mounted, it may be mounted on a space where three or four CD ROM drives are mounted.

The module 96 includes a housing HG2, upper and lower boards BD2 and BD3, a back board BD4, upper and lower guides GD1 and GD2, respectively, mounted on inner surfaces of the upper and lower boards BD2 and BD3 and apposite to each other, fifth module connectors CB5 arranged on an inner surface of the back board BD4, and sixth module connectors CB6 arranged on an outer surface of the back board BD4. The fifth and sixth module connectors CB5 and CB6 are connected with each other through a signal line of the back board BD4.

The module 96 of FIG. 6b is configured to be able to accept at least seven interfaces means, and thus since it can accept more interface means than the module 94 of FIG. 6A does, it can be applied to the target 34 having a large number of input/output terminals.

However, when the interface means 32 are mounted on the module 96 as shown in FIG. 6b, it is preferable that a connecting board is added to connect the interface means 32 to the PCI slots 24 of the main board 4.

Figure 6C:
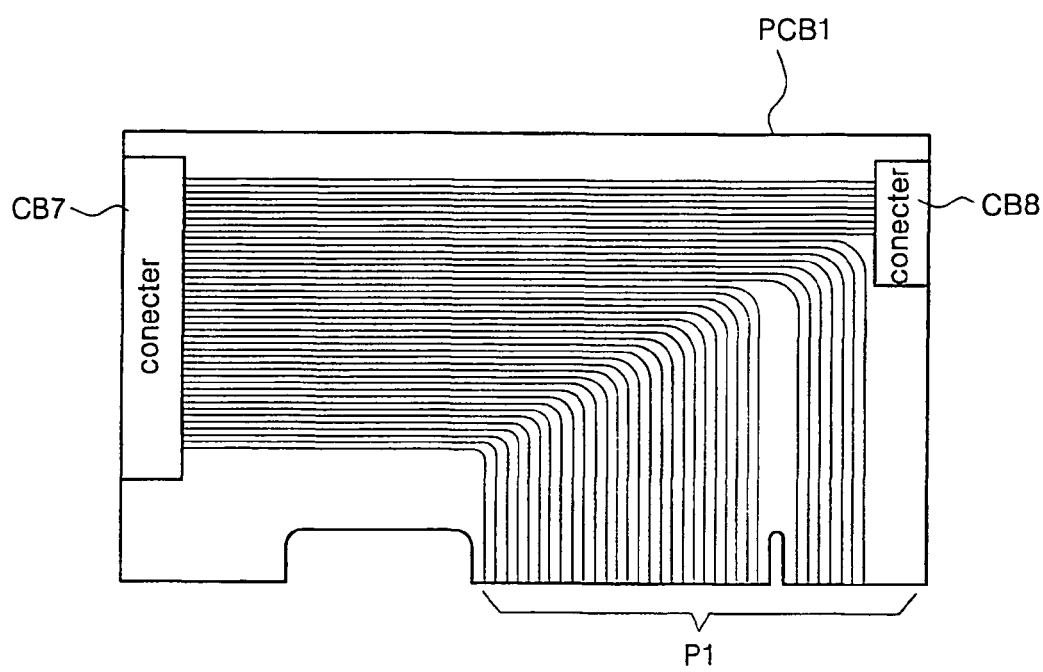
FIG. 6c shows an embodiment of the connecting board that is mounted on PCI slots when the interface means is mounted on the module of FIG. 6B.

FIG. 6c shows an embodiment of the connecting board that is mounted on the PCI slots 24 when the interface means is mounted on the module of FIG. 6b. As shown in FIG. 6c, the connecting board PCB1 includes seventh and eighth connectors CB7 and CB8. On the connecting board PCB 1, signal lines for a connection between an inserting portion P1 and the seventh connector CB7 and signal lines for a connection between the seventh and eighth connectors CB7 and CB8 are arranged. At this point, the inserting portion P1 of the connecting board of FIG. 6c is inserted into one of the PCI slots for a connection with the seventh connector CB7.

The seventh connector CB7 is connected with the sixth connector CB6 of the module 96 via, for example, a cable (not shown). The eighth connector CB8 is used to connect external signals and corresponds to the fifth connector C5 of FIG. 4.

The module 96 of FIG. 6b may be configured in such a way that only one sixth connector CB6 mounted on the outer surface of the back board BD4 is connected with the seventh connector CB7 of FIG. 6c, and the connecting board PCB1 of FIG. 6c is mounted into one of the PCI slots. In this case, the fifth connectors CB5 are commonly connected with the sixth connector CB6 via signal lines of the back board BD4.

Figure 6D:
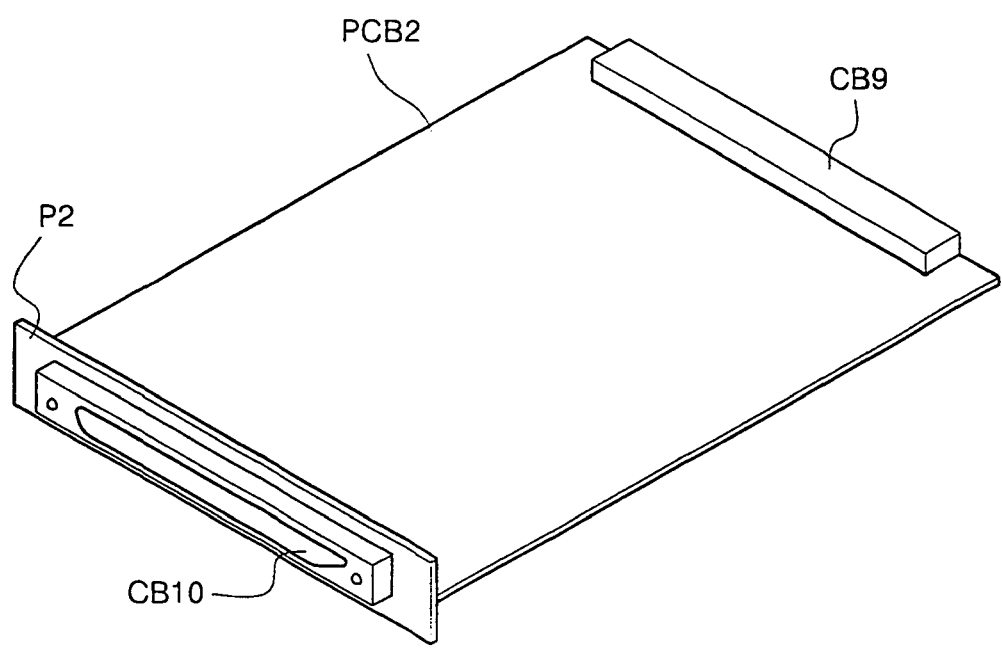
FIG. 6d shows an embodiment of an appearance form of the interface means that is mounted on the module of FIG. 6B.

FIG. 6d shows an embodiment of an appearance form of the interface means that is mounted on the module of FIG. 6b. As shown in FIG. 6d, a board PCB2, ninth and tenth connectors CB9 and CB10, and a plate P2 are provided. Components on the board PCB2 and signal lines are not shown in FIG. 6d.

The interface means 32 is configured on the board PCB2 of FIG. 6d, and the ninth connector CB9 is connected with the fifth connector CB5 of FIG. 6b. For example, the ninth connector CB9 is inserted into the fifth connector CB5 of FIG. 6b. Even though the ninth connector CB9 is connected with the fifth connector CB5 in FIG. 6d, the interface means 32 may be configured in such a way that the fifth connector CB5 is formed in the form of a slot, and an inserting portion of the board PCB2 is inserted into the slot-shaped fifth connector CB5. In this case, the ninth connector CB9 is removed from the board CB9.

Figure 6E:
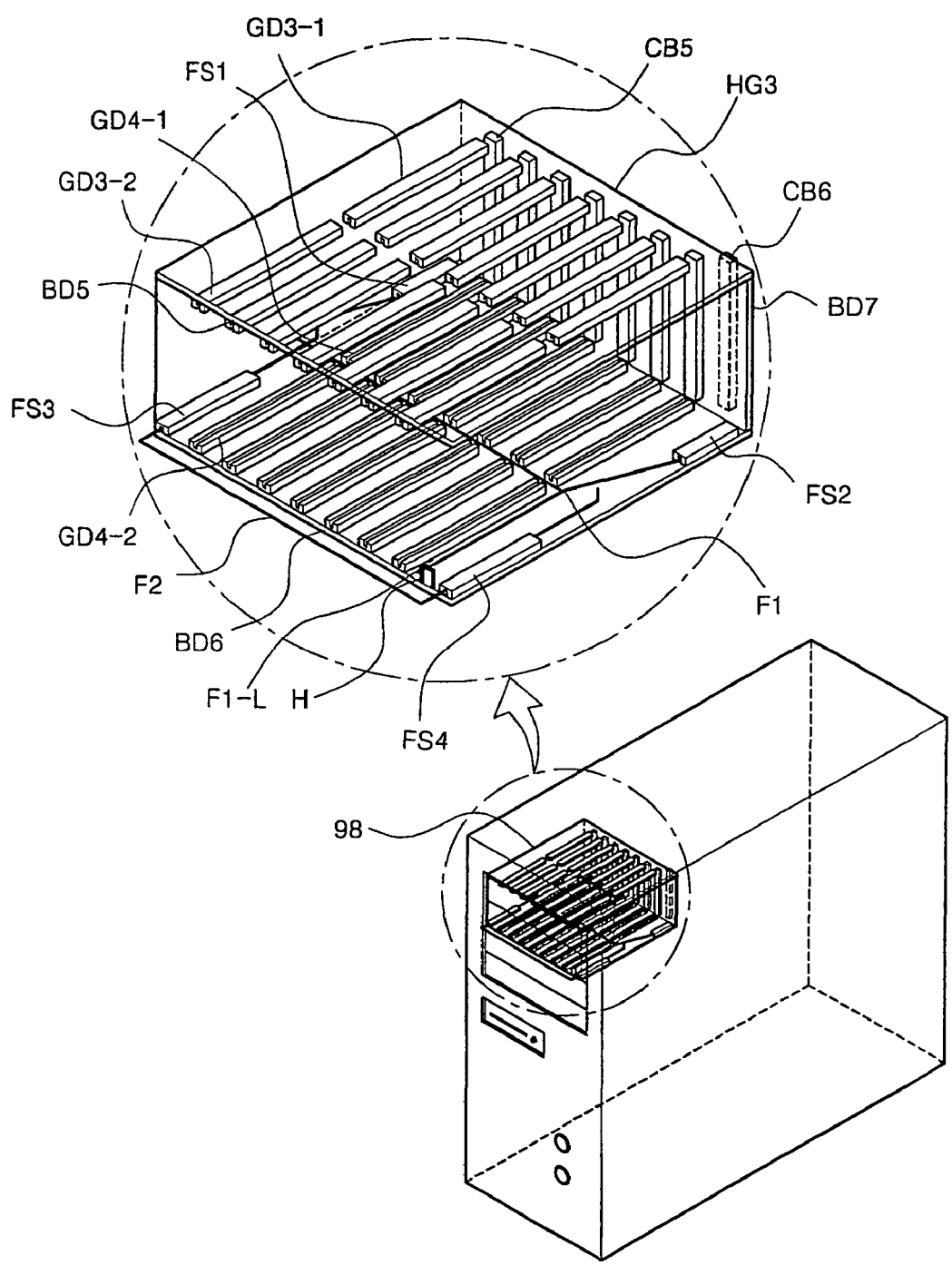
FIG. 6e shows another embodiment of the module for a connection between the interface means and the target.

FIG. 6e shows another embodiment of the module for a connection between the interface means and the target. Like that of FIG. 6b, a module 98 of FIG. 6e is mounted on a portion 82 where the CD ROM drive or the hard disk drive are mounted. The module 98 includes a housing HG3, upper and lower boards BD5 and BD6, and a back board BD7. Upper and lower guides GD3-1, GD3-2, GD4-1, and GD4-2 are, respectively, mounted on the upper and lower boards BD5 and BD6 to be apposite to each other. Connectors CB5 are arranged on an inner surface of the back board BD7. A connector CB6 is arranged on an outer surface of the back board BD7.

The interface means 32 mounted between the upper and lower guides GD3-1 and GD4-1 is firmly fixed by a fixing member F1. The fixing member F1 is held by a fixing member holders FS1 and FS2. A target supporter F2 supports the target 34 when the target 34 is attached to the connection board mounted between the upper and lower guides GD3-2 and GD4-2 for a target debugging. In other words, the target supporter F2 is pulled out in order to support the target 34. The target supporter F2 is guided and held by target supporting guides FS3 and FS4.

The upper and lower guides GD3-1, GD3-2, GD4-1, and GD4-2 may be fixed directly to upper and lower portions of the housing HG3, respectively, not via the upper and lower boards BD5 and BD6. The connectors CB5 and CB6 are connected with each other via signal lines of the back board BD7.

The interface means 32 is mounted through the upper and lower guides GD3-1 and GD4-1, and a target board or a connecting board for a connection between the interface means 32 and the target 34 is mounted through the upper and lower guides GD3-2 and GD4-2. The fixing member F1 is made of an elastic material such as a wire and serves to fix the interface means 32 when the interface means 32 is mounted through the upper and lower guides GD3-1 and GD4-1. The fixing member F1 has a sufficient width to be inserted into a space between the lower guides GD4-1 and GD4-2. That is, it is preferable that the fixing member F1 has a width equal to or slightly less than a gap between the lower guides GD4-1 and GD4-2.

The interface means 32 is mounted by throwing down an external connecting lever of the fixing means F1 after the fixing member F1 is located over a lever holder H. After mounting the interface means 32, when one's hand throwing down the external connecting lever F1-L of the fixing member F1 is taken off, the fixing member F1 moves toward a top portion of the lever holder H. Therefore, even when the target board or a connecting board for a connection between the interface means 32 and the target 34 is attached or removed, the interface means 32 does not move any more and is firmly fixed due to the fixing member F1. When an error occurs in the target 34 after a verification for the target 34 is performed, a debugging should be performed by verifying any nodes of the target 34. At this time, since a debugging can not be performed when the target 34 is mounted inside the module 98, the target 34 is taken out the module 98 for an easy debugging. That is, after pulling the target supporter F2 outwardly, the connecting board for a connection between the interface means 32 and the target 34 is mounted through the upper and lower guides GD3-2 and GD4-2, and the target board is connected with the connecting board.

By the method described above, the interface means 32 can be easily connected with the target 34 without opening the mainframe case.

FIG. 6f is an embodiment of the back board of the module according to the preferred embodiment of the present invention. The connectors CB5 are arranged on an inner surface of the back board BD7. The connector CB6 is located on an outer surface of the back board BD7. The back board BD7 further includes a power switch PSW.

The connectors CB5 and CB6 are connected with each other via signal lines SL, a control signal line CSL and power lines PL. The signal lines SL include the PCI signal line 48 of FIG. 4, signal lines of the first connectors C1 for a memory expansion, signal lines of the second connectors C2 for a connection of a plurality of the interface means 32, and signal lines connected with an external portion through a back portion of the PCI. A connector CB11 serves to supply a main power source, for example, for a personal computer, and a connector CB12 serves to supply an auxiliary power source that is used to test a chip. The power switch PSW serves to cut off the main power source that is applied from the connector CB11 under a control of the interface means 32 when data are transmitted between the interface means 32 and the target 34 during a test operation. The main power source includes noise elements such as a ripple noise and a ground noise and thus is not suitable for the power source used to test a chip. Therefore, it is preferable that the auxiliary power source is separated from the main the power source. When the interface means 32 is used as the pattern generator and/or the logic analyzer, the main the power source supplied via the connector CB11 is used till data are transferred between the main memory 18 and the memory 40 of the interface means 32. However, after a data storage from the main memory 18 to the memory of the interface means 32 is completed, the interface means 32 generates a control signal to the control signal line CSL to turn off the power switch PSW to cut-off the main power source, whereupon only a stable auxiliary power source is supplied to the power lines PL via the connector CB12. When a data transmission between the interface means 32 and the target 34 is completed, the interface means 32 generates a control signal to the control signal line CSL to turn on the power switch PSW, whereupon the main power source is supplied to the power lines PL via the connector CB11. Due to the back board BD7 having such a configuration, since only the auxiliary power source is supplied during a test operation, a stable test operation can be performed.

Figure 7A:
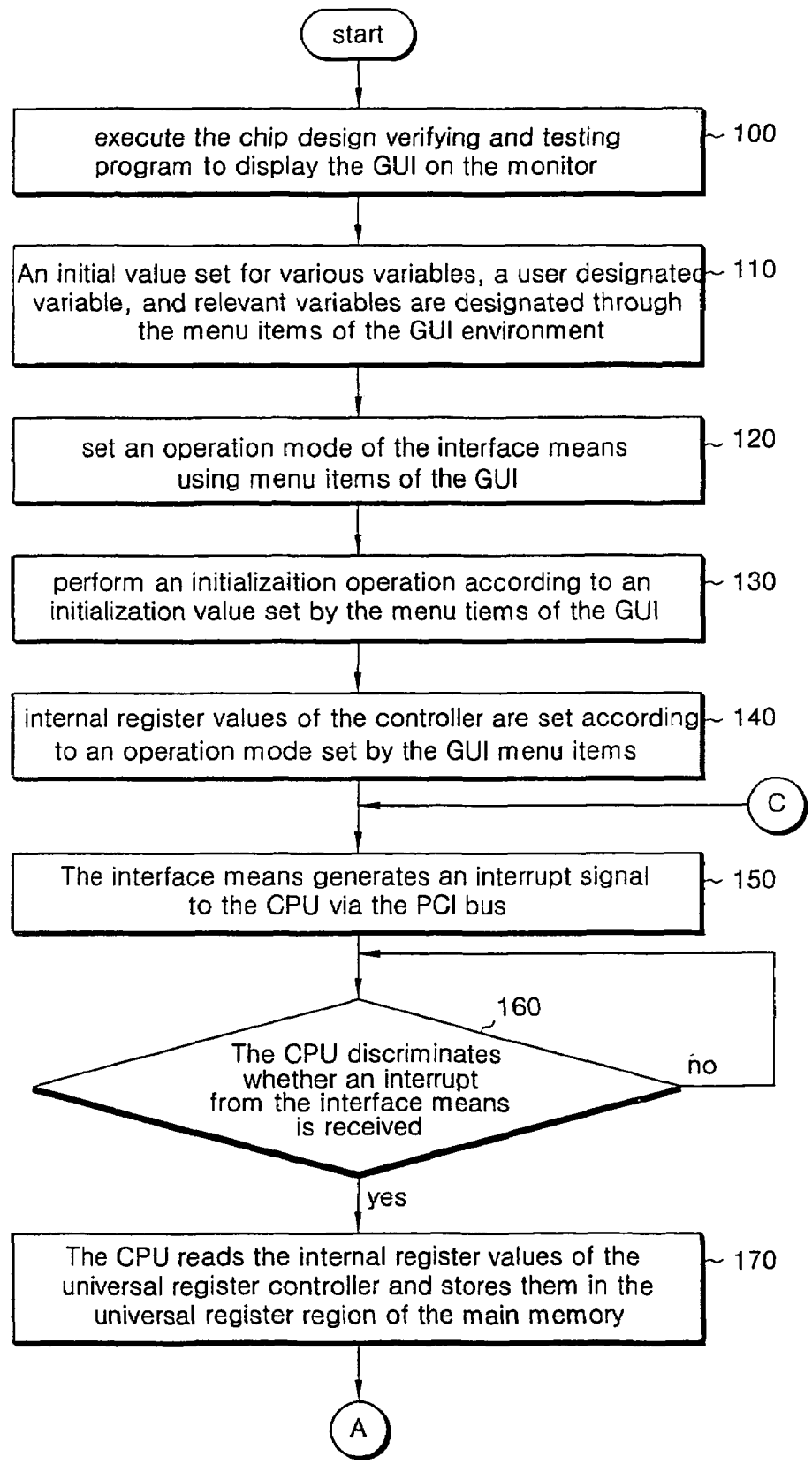
FIGS. 7a to 7c shows a flow chart illustrating an internal operation of the mainframe when the chip design verifying and chip testing program of the chip design verifying and chip testing apparatus is executed.
Figure 7B:
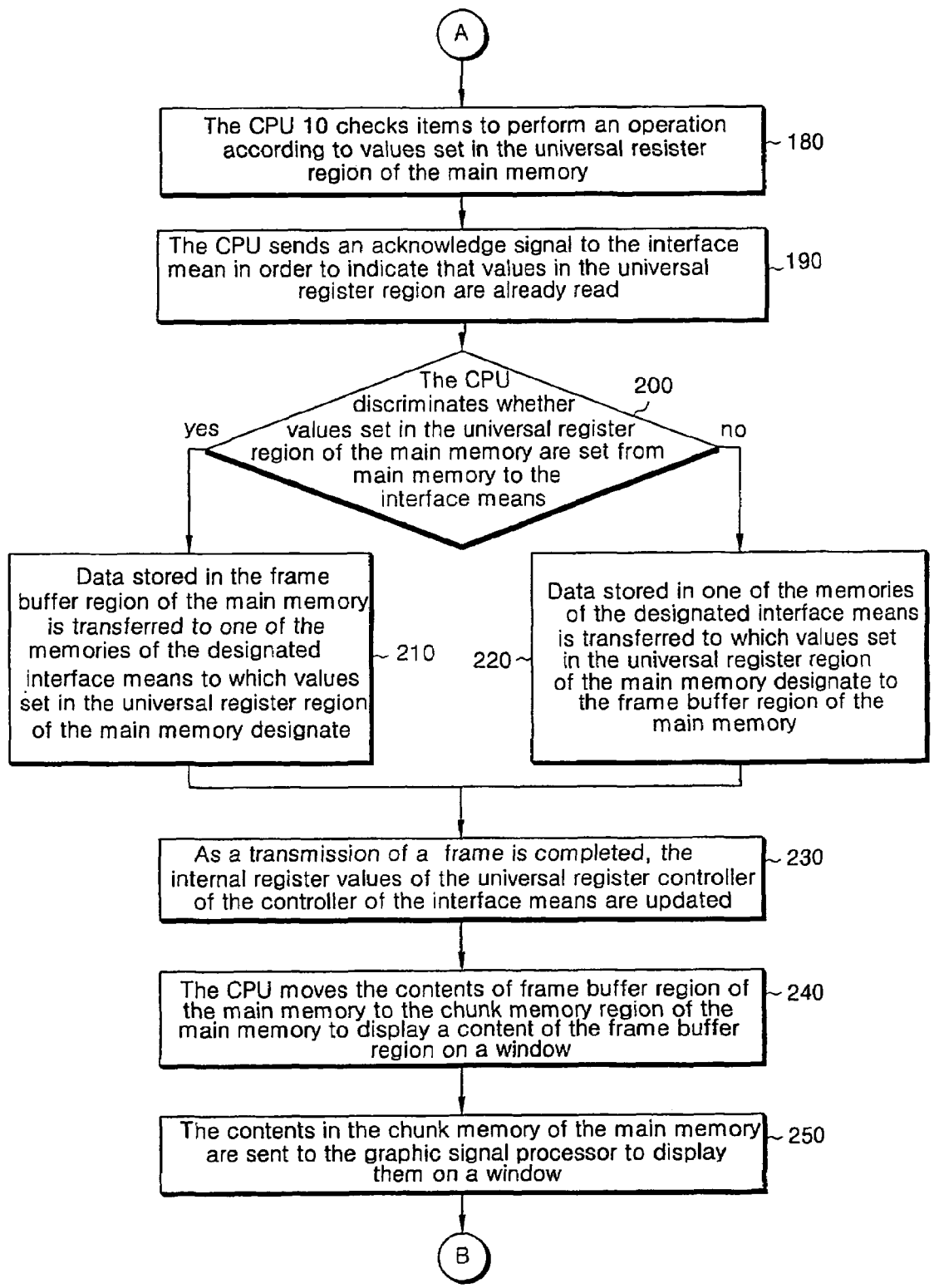
Figure 7C:
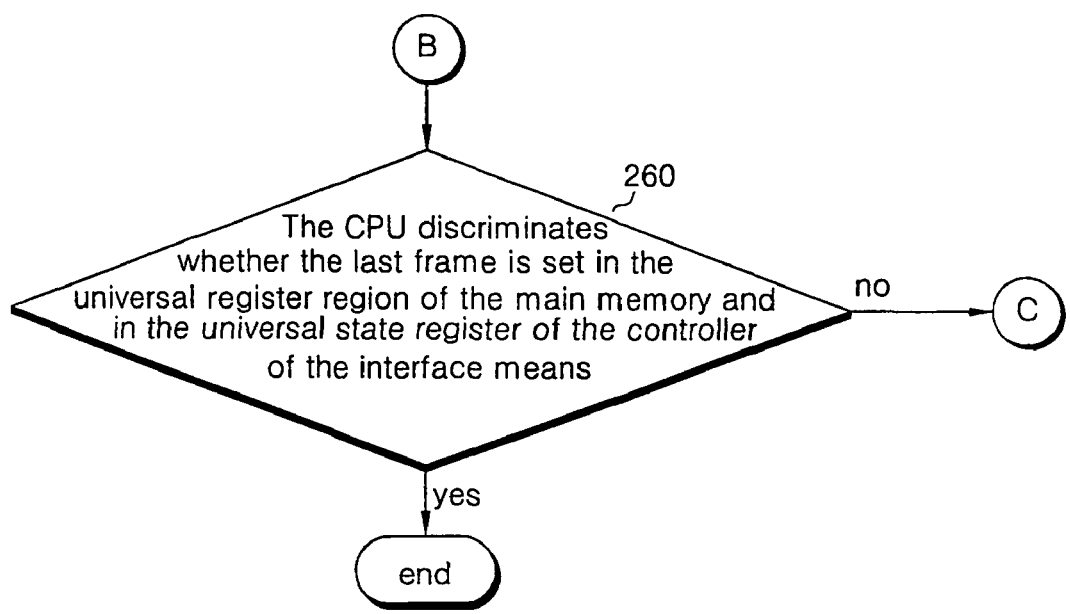

FIGS. 7a to 7c shows a flow chart illustrating an internal operation of the mainframe when the chip design verifying and chip testing program of the chip design verifying and chip testing apparatus is executed. First, when the chip design verifying and chip testing program is executed, the CPU 10 brings an application program stored in the hard disk 22 to a region of the memory 18 of FIG. 8 corresponding to the chip design verifying and chip testing program, and displays the GUI of FIG. 9 on the monitor through the graphic signal processor 12 (step 100).

A device user designates an initial value set for various kinds of variables, user-designated variables, and relevant variables using the GUI menu items (step 110). In the step 110, signals are allocated to pins of the third and fourth connectors C3 and C4 of the interface means 32 of FIG. 4. A size of each of the frame buffers of the interface means 32 is determined, and a size of the chunk memory for a display operation is determined. An input data file to be inputted to the target or a file of the hard disk 22 storing a test vector is designated, and a file of the hard disk 22 to store a data outputted from the target is also designated. Further, an on-line or off-line mode is designated. In the on-line mode, data transmitted from the target 34 to the interface means 32 are displayed on the monitor 1. In the off-line mode, data transmitted from the target 34 to the interface means 32 are not displayed on the monitor but stored in a designated file of the hard disk 22. However, when both the on-line and off-line mode are designated at the same time, data transferred from the target 34 to the interface means 32 can be displayed on the monitor 1, stored in the designated file of the hard disk 22.

Then, the device user sets an operation mode of the interface means 32 using menu items of the GUI (step 120). The operation mode includes a verifying mode and a testing mode. In the verifying mode, it is set what usage of the interface means 32 has (i.e., a signal application or/and a signal storage), and an operation is performed that applies or/and stores the designated input and output files or the test vector file to/from the target continuously. In the test mode, it is set whether to use the interface means 32 as a pattern generator or/and a logic analyzer, and an operation is performed that inputs or outputs data of one frame unit to the target 34 at a high speed.

An initialization operation is performed according to an initialization value set by the menu items of the GUI (step 130). In the step 130, an initialization value is transferred to the interface means 32 to perform an initialization operation.

The internal register values of the universal register controller 60 are set according to the initialization values set by the menu items of the GUI and the operation mode (step 140). The internal registers of the universal register controller 60 store an identification number set by the switch SW of the interface means 32, informations regarding whether to occupy the PCI bus, a signal transmission direction between the main memory 18 and the interface means 32, a memory to be accessed, an interrupt for a transmission, an interrupt for a transmission termination, a speed monitoring value, a change of a frame size, an information regarding the last frame transmission, a reset information, etc.

The interface means 32 generates an interrupt signal to the CUP 10 via the PCI bus (step 150).

The CPU 10 discriminates whether an interrupt signal from the interface means 32 is reached (step 160). If an interrupt signal is not generated, the CPU 10 continuously looks out whether an interrupt signal is generated. On the other hands, when an interrupt signal is generated, the CPU 10 reads the internal register values of the universal register controller 60 and stores them in the universal register region of the main memory 18 of FIG. 8 (step 170).

The CPU 10 checks items to perform an operation according to values set in the universal register region of the main memory 18 (step 180).

The CPU 10 sends the interface means 32 an acknowledge signal indicating that values in the universal register region are already read (step 190).

The CPU 10 discriminates whether values set in the universal register region of the main memory 18 are set from the main memory 18 to the interface means 32 (step 200).

If values set in the universal register region of the main memory 18 are set from the main memory 18 to the interface means 32 in the step 200, the interface means 32 transfers data stored in the frame buffer region of the main memory 18 to one of the memories M1 to M4 of the memory 40 of the designated interface means 32 to which values set in the universal register region of the main memory 18 designate (step 210).

If values set in the universal register region of the main memory 18 are not set from the main memory 18 to the interface means 32 in the step 200, the interface means 32 transmits data stored in one of the memories M1 to M4 of the memory 40 of the designated interface means 32 to which values set in the universal register region of the main memory 18 designate to the frame buffer region of the main memory 18 (step 220).

As a transmission of a first frame is completed, the internal register values of the universal register controller 60 of the controller 42 of the interface means 32 are updated (step 230).

The CPU 10 moves a content of the frame buffer region of the main memory 18 to the chunk memory region of the main memory 18 to display the content of the frame buffer region on a window (step 240).

The contents in the chunk memory of the main memory 18 are sent to the graphic signal processor 12 to display them on a window (step 250).

The CPU 10 discriminates whether the last frame is set in the universal register region of the main memory 18 and in the universal state register 60 of the controller 60 of the interface means 32 (step 260).

If the last frame is set in the universal register region of the main memory 18 and in the universal state register 60 of the controller 60 of the interface means 32, an operation is finished. However, if the last frame is not set in the universal register region of the main memory 18 and in the universal state register 60 of the controller 60 of the interface means 32, an operation turns to the step 150.

Figure 8:
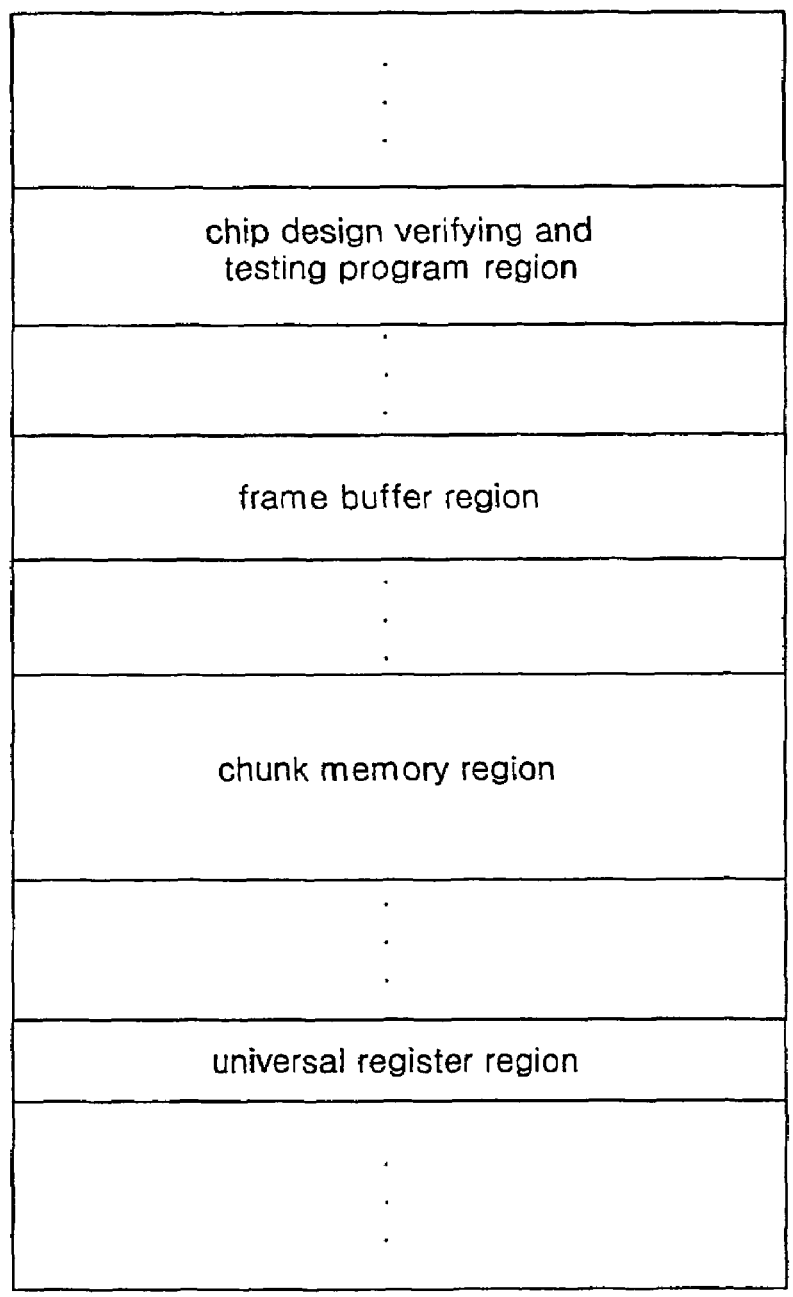
FIG. 8 shows an allocation of a memory region inside a mainframe when the chip design verifying and chip testing program is executed.

FIG. 8 shows an allocation of the memory region inside the mainframe 2 when the chip design verifying and chip testing program is executed. The main memory 18 includes a chip design verifying and chip testing program region, a frame buffer region, a chunk memory region, and a universal register region.

Figure 9:
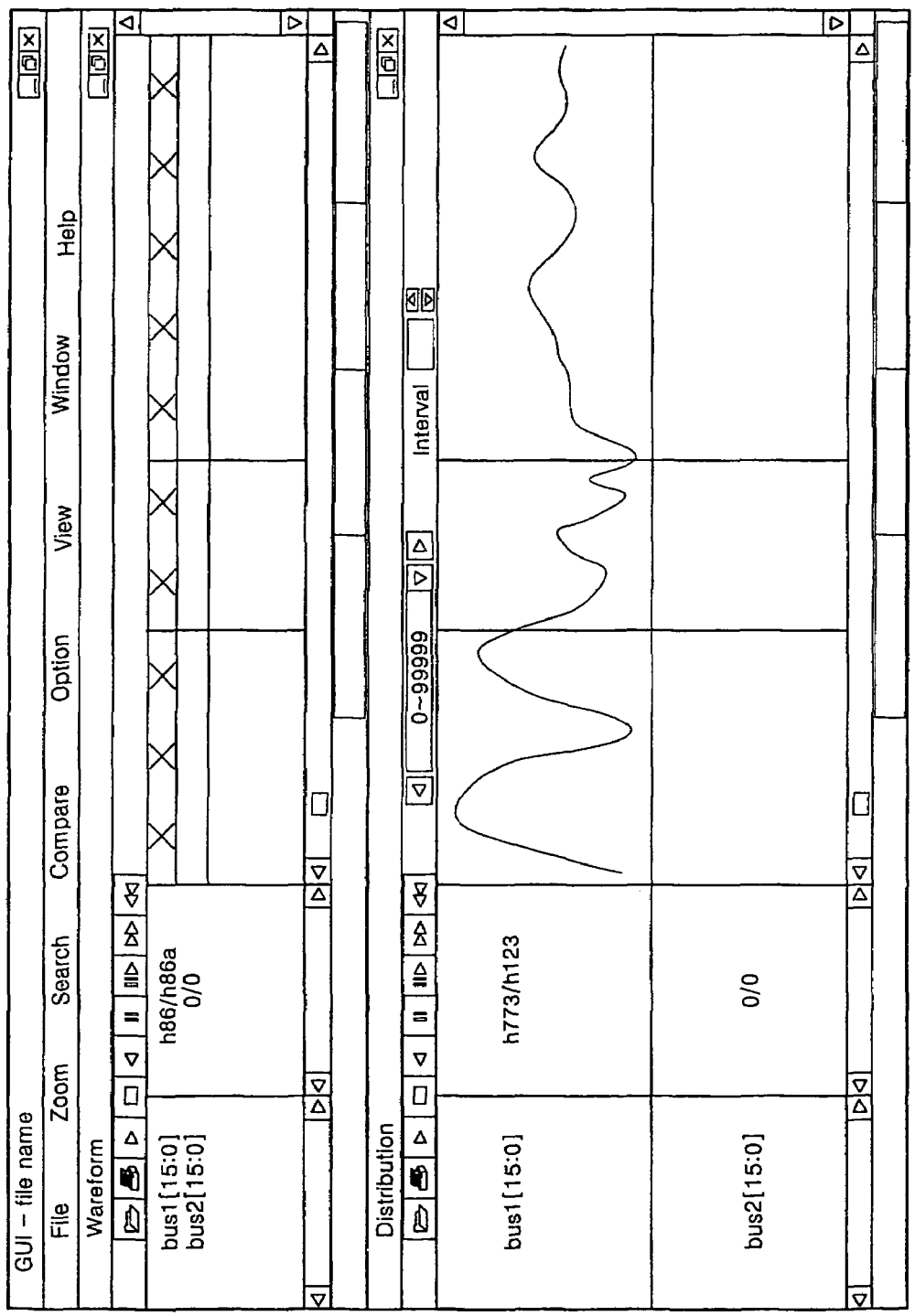
FIG. 9 shows an embodiment of a GUI displayed on a monitor of FIG. 1 when the chip design verifying and chip testing program is executed.

FIG. 9 shows an embodiment of the GUI displayed on the monitor of FIG. 1 when the chip design verifying and chip testing program is executed. The GUI includes menu items required to perform a chip design verification and test and provides various window environments. The GUI environment of FIG. 9 provides only a waveform window that is widely used for a general purpose, and a distribution window. However, the GUI environment of the present invention provides a waveform window for an audio block, an image display window for a video block, a spectrum analyzing window for a telecommunication block, a microprocessor development system (MDS) environment for a MCU block, a window indicating an arrangement on a two or three dimensional coordinates for an operation related to analysis between bus signals, a window indicating a state of the periphery measuring instruments (e.g., an output voltage, an offset voltage, an output frequency, a duty ratio, etc), a window indicating a waveform generation, an environment of a logic analyzer used generally during an operation analysis of a digital logic and a debugging. In other words, the GUI environment of the present invention provides not only a window environment suitable for finding errors of each of the blocks that constitute the target 34 but also a window environment capable of controlling both an external power supply used for a verification and a frequency generator on a single monitor.

Since the chip design verifying and chip testing apparatus can be used a chip tester as well as a chip design verifier, the interface means 32 should be able to be operated as the pattern generator and the logic analyzer. In order to use the interface means 32 as the chip tester, the test vector should be already stored in the memory 40 of the interface means 32. In case that a capacity of the test vector is relatively small, no problem occurs. However, as a capacity of the test vector becomes larger, a capacity of the interface means 32 should become larger. As described above, a memory capacity of the interface means 32 can be expanded. However, there is a limitation to expanding a memory capacity of the interface means 32, and thus it is preferable to use a method of compressing and then storing data in the interface means 32. In other words, the test vector stored in the hard disk 22 is compressed using a software program and then stored in the frame buffer region of the main memory 18, and the compressed data are stored in the memory 40 of the interface means 32. The interface means 32 restores the compressed data by the data compression/restoration controller 72 of the controller 42 and then transmits them to the target 34.

On the other hands, data inputted from the target 34 are compressed by the data compression/restoration controller 72 of the controller 42 of the interface means 32 and then stored in the memory 40. The compressed data are stored in the frame buffer region of the main memory 18, and the compressed data stored in the frame buffer region are restored using a software program to be displayed on the GUI.

A compression and restoration method according to the preferred embodiment of the present invention is explained below with reference to drawings.

FIG. 10 is a table showing a meaning of a symbol with respect to a symbol code. The symbol code represents a data logic state and constitutes the test vector. In the table of FIG. 10, a symbol "0" denotes a code "000" and means an input low, a symbol "1" denotes a code "001" and means an input high. A symbol "L" denotes a code "010" and means an output low, and a symbol "H" denotes a code "011" and means an output high. A symbol "S" denotes a code "100" and means a week low, and a symbol "T" denotes a code "101" and means a week high. A symbol "Z" denotes a code "110" and means a high impedance, and a symbol "X" denotes a code "111" and means an unknown. The test vector of the same form as shown in FIG. 10 is stored in the hard disk 22 of the mainframe 2.

Figure 11:
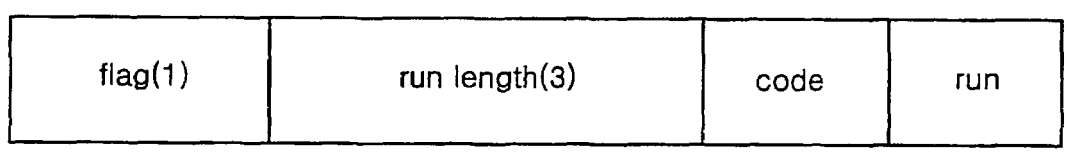
FIG. 11 shows a data format when an input file selected by the chip design verifying and chip testing program is compressed using a software program and then is transmitted.

FIG. 11 shows a data format when an input file selected by the chip design verifying and chip testing program is compressed using a software program and then is transmitted. The data format includes a flag of one bit, a run length of three or four bits, a code, and run.

In the flag, when a logic state comes under either no state variation or a state variation of the highest frequency already defined, "0" is inscribed. If not so, "1" is inscribed. At this point, a logic state that comes under a state variation of the highest frequency already defined represents cases that a logic state varies from "0" to "1", form "1" to "0", from "L" to "H", and from "H" to "L" in the table of FIG. 10.

The run length is a value that determines a length of a run arranged at the end portion of the data format. When the input and output signals that constitutes the test vector is more than 128 in number, four bits are allocated in the run length, whereas when the input and output signals that constitutes the test vector is less than 128 (i.e., 0 to 127) in number, three bits are allocated in the run length.

A code is one that indicates a symbol of logic state of FIG. 10, and a length of the code is determined by the flag. When the flag is "0", a length of the code is one bit. At this point, a code "0" means that there is no a state variation, and a code "1" means that there is a state variation. When the flag is "1", a length of the code is three bits, and one of eight codes of FIG. 10 is inscribed.

In the run, the number of times that the designated logic state is repeated is inscribed.

In general, input data include eight logic states of FIG. 10 and are stored in a recording medium such as the hard disk 22 of the mainframe 2. When an input file is selected to perform a verification or a test, data are compressed by a software program and then stored in the frame buffer region of the main memory 18. Then, the compressed data stored in the frame buffer region are stored in the memory 40 of the interface means 32.

A method of compressing data by a software program using the chip design verifying and chip testing program is explained with reference to FIGS. 12 and 13.

FIG. 12 shows an embodiment of the test vector stored in the hard disk. Twenty data of from "A" to "T" represent a logic state of each signal according to a time variation and are compressed in the same form as shown in FIG. 13 and is transferred in the data format of FIG. 11. FIG. 13 shows input and output data of the test vector that are compressed in the data format of FIG. 11, and a logic state of and a run of the input data of FIG. 12.

As shown in FIG. 13, the logic state and the run of a first row data of the input data of FIG. 12 can be represented as H(5)L(2)0(3)1(2)0(1)1(5)X(2). H(5) is coded as "1_011_011_101", and L(2) is coded as "1_010_010_10", and 0(3) is coded as "1_010_000_11". After the input data are coded in the same form as the first compressed input data of FIG. 13, the input data are transmitted. The logic state and the run of a second row data of FIG. 13 can be represented as o(2)0(2)1(3)o(8)0(1)o(4), which represents a variation of from the first row data to the second row data. At this point, "o" means a case that the flag is "0", a code is "0", and therefore there is no variation of the logic state; "0" means a case that the flag is "0", a code is "1", and therefore there is a variation of the logic state; and "1" means a case that the flag is "1", and a code has a value of one of eight logic state of FIG. 9.

Therefore, data A and B of the first and second row data of the table of FIG. 12 are maintained from HH to HH and thus are represented as o(2). Data C and D of the first and second row data of the table of FIG. 12 vary from HH to LL and thus are represented as 0(2). Using the method described above, the logic state and the run of the second input data are represented as shown in FIG. 13. Also, when these data are changed into the data format of FIG. 11, these data are represented as the compressed input data of the table of FIG. 13. Using the method described above, the third and fourth row input data can also be represented as the logic state, the run and the compressed input data of the table of FIG. 13.

When an input file stored in the hard disk 22 is selected using the menu items on the GUI by performing the chip design verifying and chip testing program, and data compression mode is designated, the input data constituting the test vector stored in the input file are compressed by a software program through the data compression method described above and are transmitted to the interface means 32.

A data restoration is performed by reversely performing the compression method described above, and thus its explanation is omitted.

The data compression method is one which compresses all of the input data and the output data into one file without dividing the input data and the output data of the test vector. However, in the step 110 of FIG. 7, in a state that the input data and the output data transmitted through the third connector C3 are designated to correspond to respective pins, the compressed test vector can be divided into the input data and the output data to be processed as separate files.

A method of verifying an abnormal operation of the target for the former compression method is as follows. First, the data compression/restoration controller 72 of the controller 42 of the interface means 32 restores data stored in the memory 40 by a hardware, e.g., a restoration circuit, by the data restoration method. Then, the data compression/restoration controller 72 applies the input data to the target 34. Also, the data compression/restoration controller 72 compares the output data with data outputted from target 34 via the trigger condition controller 64 to store an address where the comparison result is a mismatch in the memory. A mismatch is continuously counted to be stored in the memory. When a corresponding address and a mismatch counter, which represent a mismatch result, reach a user designated counter value, a comparison operation is not performed any more.

A method of verifying an abnormal operation of the target for the later compression is as follows. First, the compressed input test vector in the hard disk 22 is transmitted to the memory 40 of the interface means 32 via the main memory 18, and the data compression/restoration controller 72 of the controller 42 of the interface means 32 restores data stored in the memory 40 by a hardware, e.g., a restoration circuit, by the data restoration method and then applies them to the target 34. Data outputted from the target 34 are compressed by a hardware, e.g., a compression circuit, by the data compression method described above and then are stored in the memory 40. The compressed output data stored in the memory 40 are transferred to the main memory 18 again. And the compressed data in the main memory 18 are restored by the software program of the data compression/resotration and are compared with the output test vector already stored in the main memory 18.

As another embodiment of compressing the test vector, when compressing data stored in the main memory 18 and transmitting them to the interface means 32, data can be compressed using the data compression/restoration controller 72 of the controller 42 of the interface means 32 other than a software program. This method is a method that stores the input data constituting the test vector stored in the hard disk 22 in the memories M1 and M2 of the memory 40 of the interface means 32, compresses the input data stored in the memories M1 and M2 of the interface means 32 by the data compression/restoration controller 72 and then stores them in the memories M3 and M4, and stores data stored in the memories M3 and M4 in the hard disk 22 through the main memory 18. At this moment, a connection with the target 34 is disconnected.

In case that the input file of or the test vector file of the target 34 is already compressed and stored in the hard disk 33, an access time of the hard disk 22 to read and store files of the same size can be as reduced as a data compression ratio.

Since data are compressed and transmitted during a data transmission between the main memory 18 and the interface means 32, the chip design verifying and chip testing apparatus can perform a high-speed data transmission. Further, since a large-sized test vector is compressed and stored in the memory 40 of the interface means 32, a large-sized test vector can be stored in the relatively small-sized memory 40. Therefore, it is possible to effectively use the main memory 18 and the memory 40 of the interface means 32, which have a limitation to using the interface means 32 as the pattern generator and the logic analyzer.

Figure 14A:
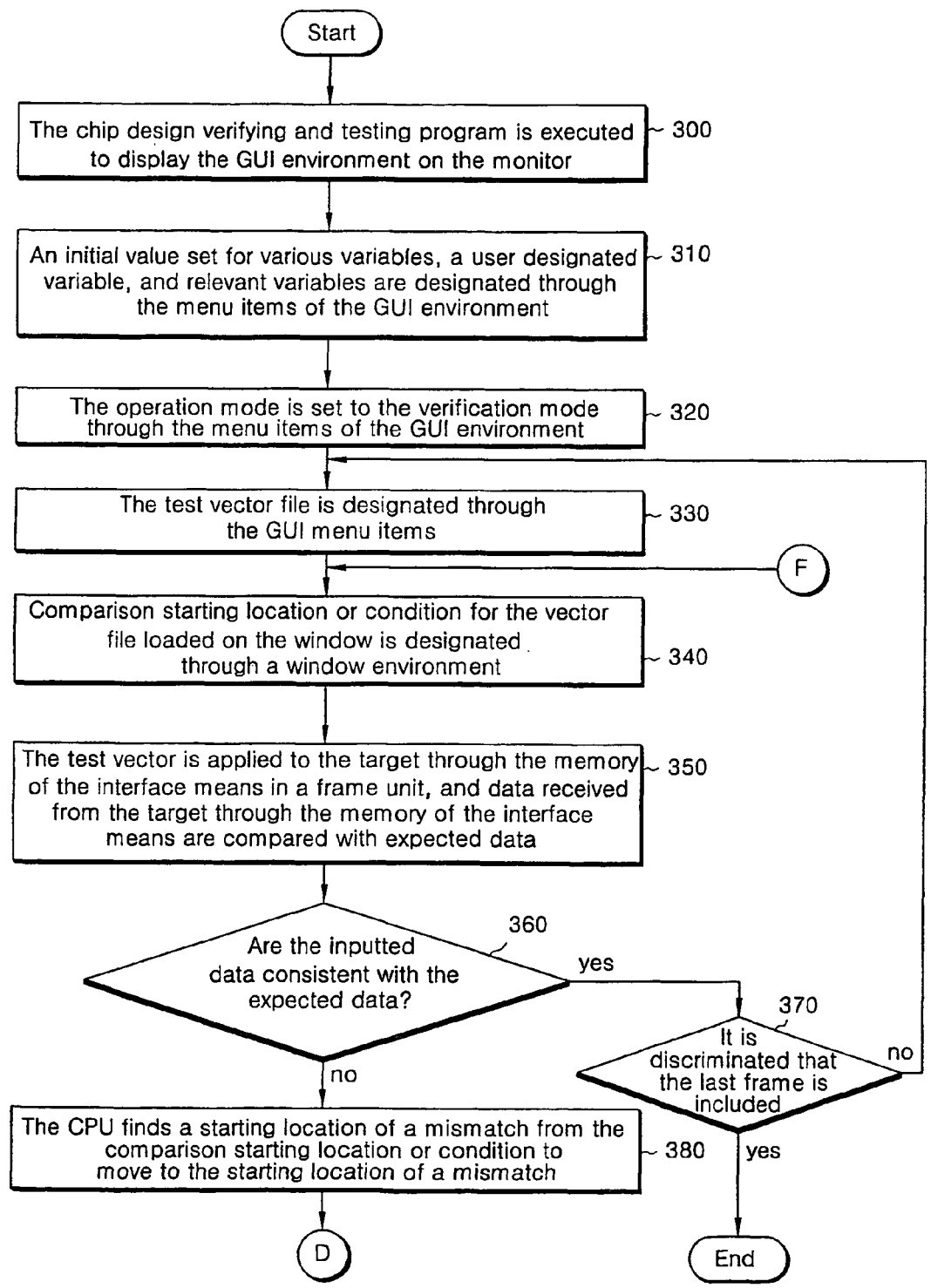
Figure 14B:
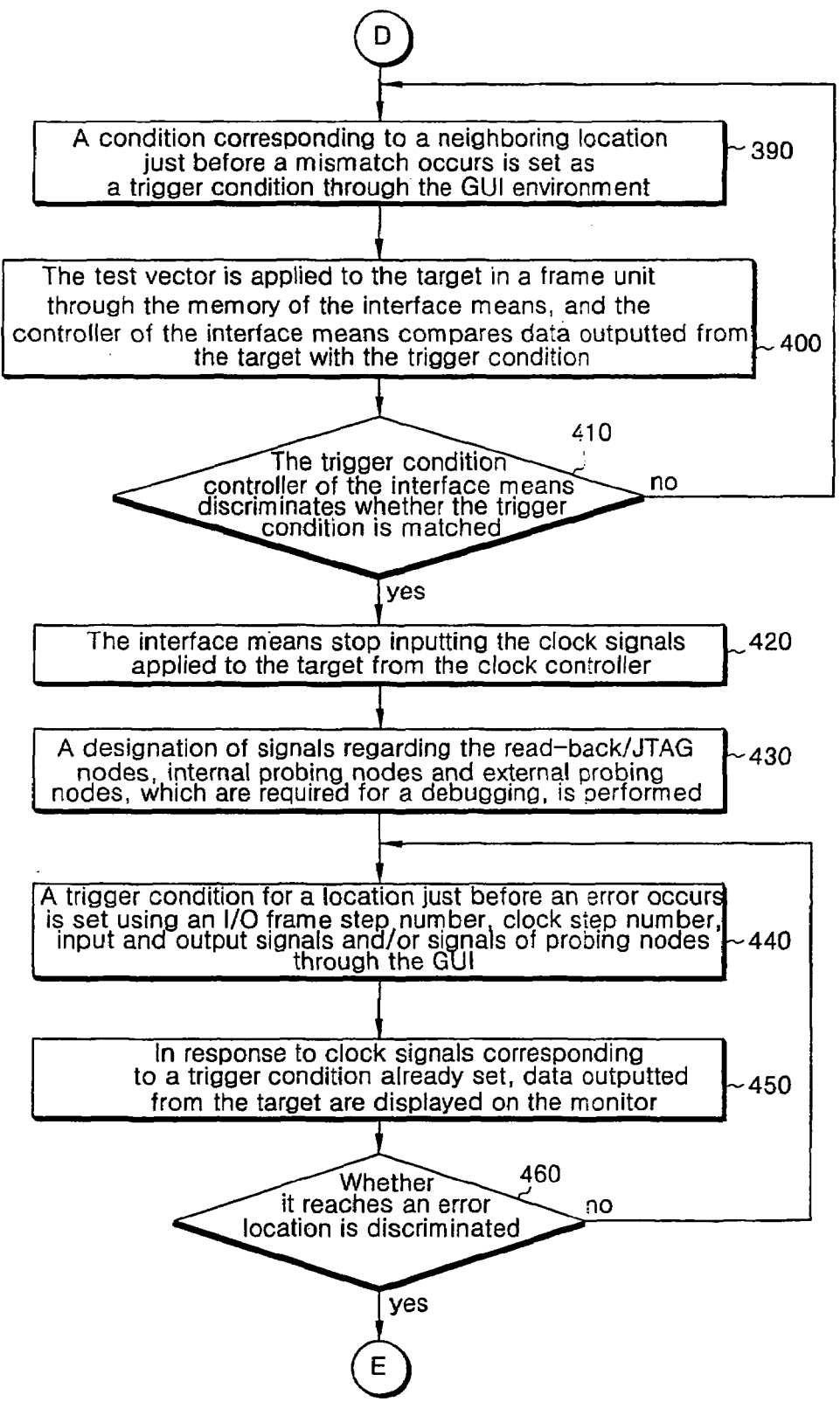

FIGS. 14a to 14c are a flow chart illustrating a chip design verifying method by the inventive chip design verifying and chip testing apparatus and show a target matching process to enable the hardware model of and the software model of the target to show the same result as the simulation result by using the test vector having a regular time interval prepared by the simulation result, prior to performing a verification of the target 34. In FIGS. 14a to 14c, a method of preparing the compressed test vector is carried out according to the later compression method.

First, the chip design verifying and chip testing program is executed, so that the GUI environment is displayed on the monitor 1 (step 300).

Initial values set for various variables, user designated variables, and relevant variables are designated through the menu items of the GUI environment (step 310).

The operation mode is set to the verification mode through the menu items of the GUI environment (step 320). In other words, whether to use the interface means 32 to apply signals and/or to store signals is set.

The steps 300 through 320 are performed in the same method as the steps 100 through 120 of FIG. 7.

The test vector file is designated through the GUI menu items (step 330). When the test vector file is selected, the vector file is displayed on a window.

A comparison starting location or a comparison starting condition for the vector file loaded on the window is designated through a window environment (step 340). That is, a condition to perform a comparison, a location of a certain signal to start a comparison, and a pattern to be matched are designated.

The test vector is applied to the target 34 through the memory 40 of the interface means 32 in a frame unit, and data received from the target 34 through the memory 40 of the interface means 32 are compared with expected data (step 350).

The CPU 10 discriminates whether the inputted data are consistent with the expected data (step 360).

When the input data are consistent with the expected data, it is discriminated that the last frame is received (step 370). When the last frame is received, an operation is finished.

When the input data are no consistent with the expected data, the CPU 10 finds a starting location of a mismatch from the comparison starting location/condition to move to the starting location of a mismatch. (step 380). That is, it moves to a corresponding location on a window.

A condition to approach a neighboring location just before a mismatch occurs is set as a trigger condition through the GUI environment (step 390). In this step, if the designed chip includes the MCU and the ROM and it is required to perform a debugging while monitoring a instruction command performing process, the same assembly code produced the ROM code is loaded on the GUI environment, and a brake-point for an address of a portion having doubts is set. At this moment, an address to be set as the brake-point is stored in the trigger condition controller 64 of the interface means 32.

The test vector is applied to the target 34 in a frame unit through the memory 40 of the interface means 32, and the trigger condition controller 64 of the interface means 32 compares the data outputted from the target 34 with the trigger condition (step 400).

The trigger condition controller 64 of the interface means 32 discriminates whether the trigger condition is matched (step 410). Also, in the step 410, the trigger condition controller 64 of the interface means 32 discriminates whether an address of the ROM to be applied from the target 34 to the interface means 32 is consistent with an address set as the brake-point. When the trigger condition is matched, the interface means 32 stop inputting the clock signals applied to the target 34 from the clock controller 66 (step 420). Alternately, when the address of the ROM to be applied from the target 34 to the interface means 32 is consistent with the address set as the brake-point, an input of the clock signals applied from the clock controller 64 of the interface means 32 to the target 34 is stopped.

A designation of signals regarding the read-back/JTAG nodes, internal probing nodes and external probing nodes, which are required for a debugging, is performed using the GUI (step 430).

A trigger condition for a location just before an error occurs is set using an I/O frame step number, a clock step number, input and output signals and/or signals of probing nodes through the GUI (step 440).

In response to clock signals corresponding to a trigger condition already set, data outputted from the target 34 are displayed on the monitor (step 450). For example, if the clock step number is set to "five" in the GUI environment as a trigger condition, in response to clock signals of five times outputted from the clock controller 66 of the interface means 32 to the target 34, data outputted from the target 34 are all stored in the memory 40 of the interface means 32, and then data stored in the memory 40 are displayed on the GUI environment.

Then, it is discriminated whether it reaches an error location or not (step 460). If not so, the steps 440 and 450 are repeatedly performed. If it reaches an error location, a cause of an error is analyzed through a process that it reaches a mismatch location (step 470).

It is discriminated whether a cause of an error is found (step 480).

When a cause of an error is found, a hardware or a software model of the target 34 is corrected (step 490). When a portion including a cause of an error exists in the field programmable gate array that is a hardware model, a block including the cause of an error is corrected to produce the bit stream for the field programmable gate array, so that the field programmable gate array is reprogrammed. Also, when a portion including a cause of an error exists in the ROM code that is a software model, the assembly code of the portion is corrected to update the ROM code.

If a cause of an error is not found in the step 480, signals regarding the read-back/JTAG nodes, internal probing nodes and external probing nodes are additionally designated, and then an operation turns to the step 340 (step 500)

Figure 15A:
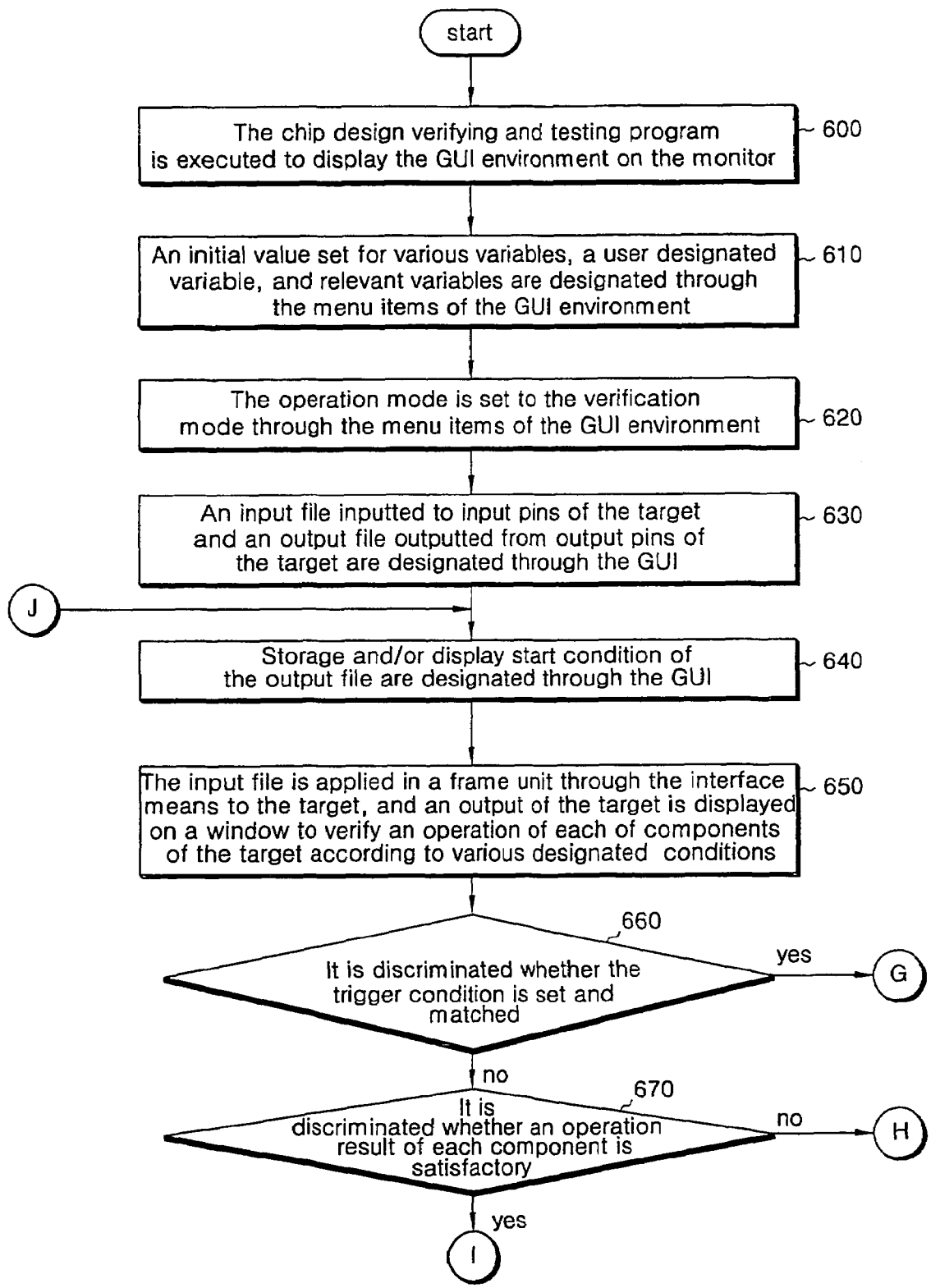
FIGS. 15a to 15c are flow charts illustrating an operation to verify the target using the chip design verifying and chip testing apparatus according to the preferred embodiment of the present invention.
Figure 15B:
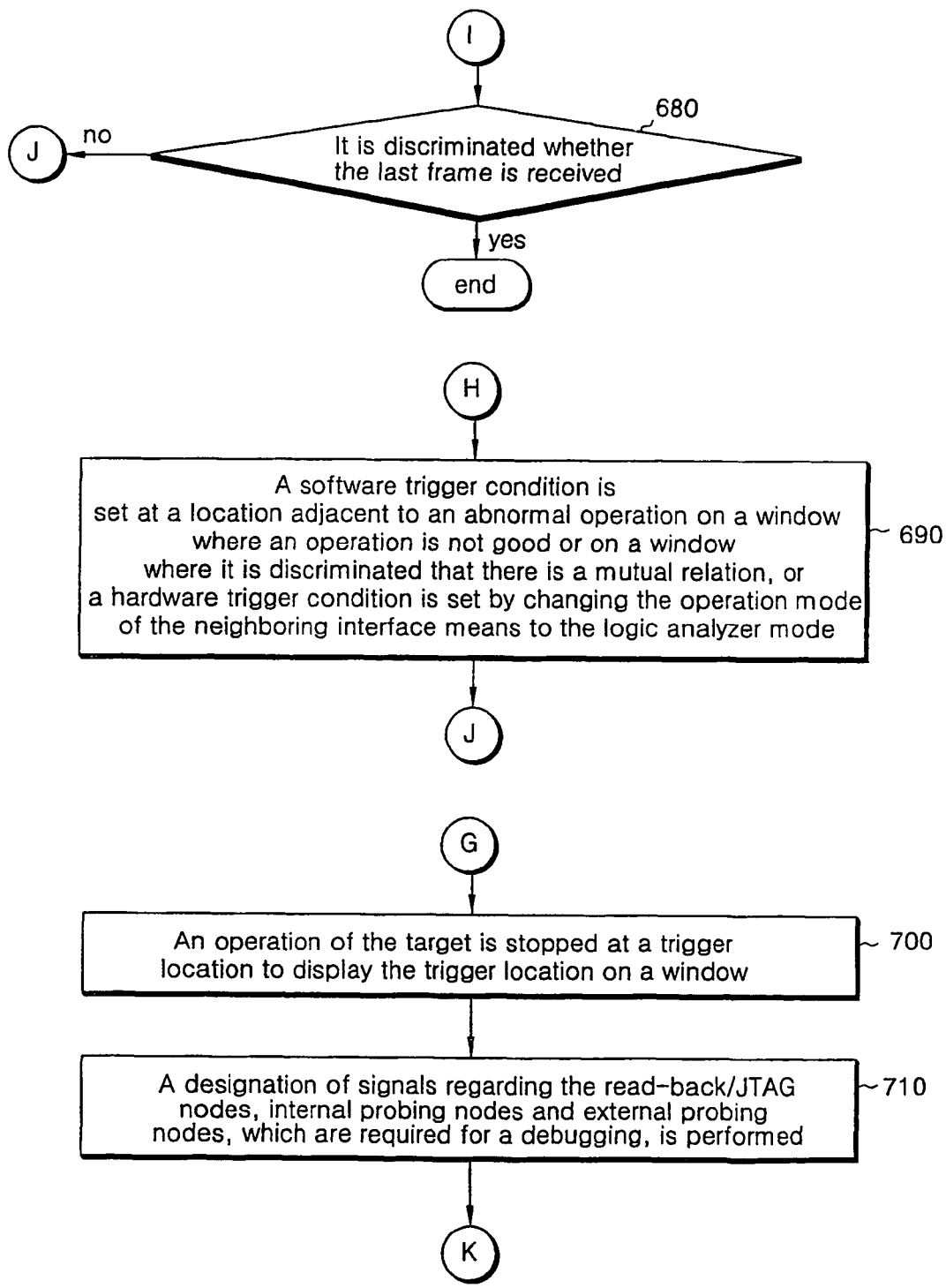
Figure 15C:
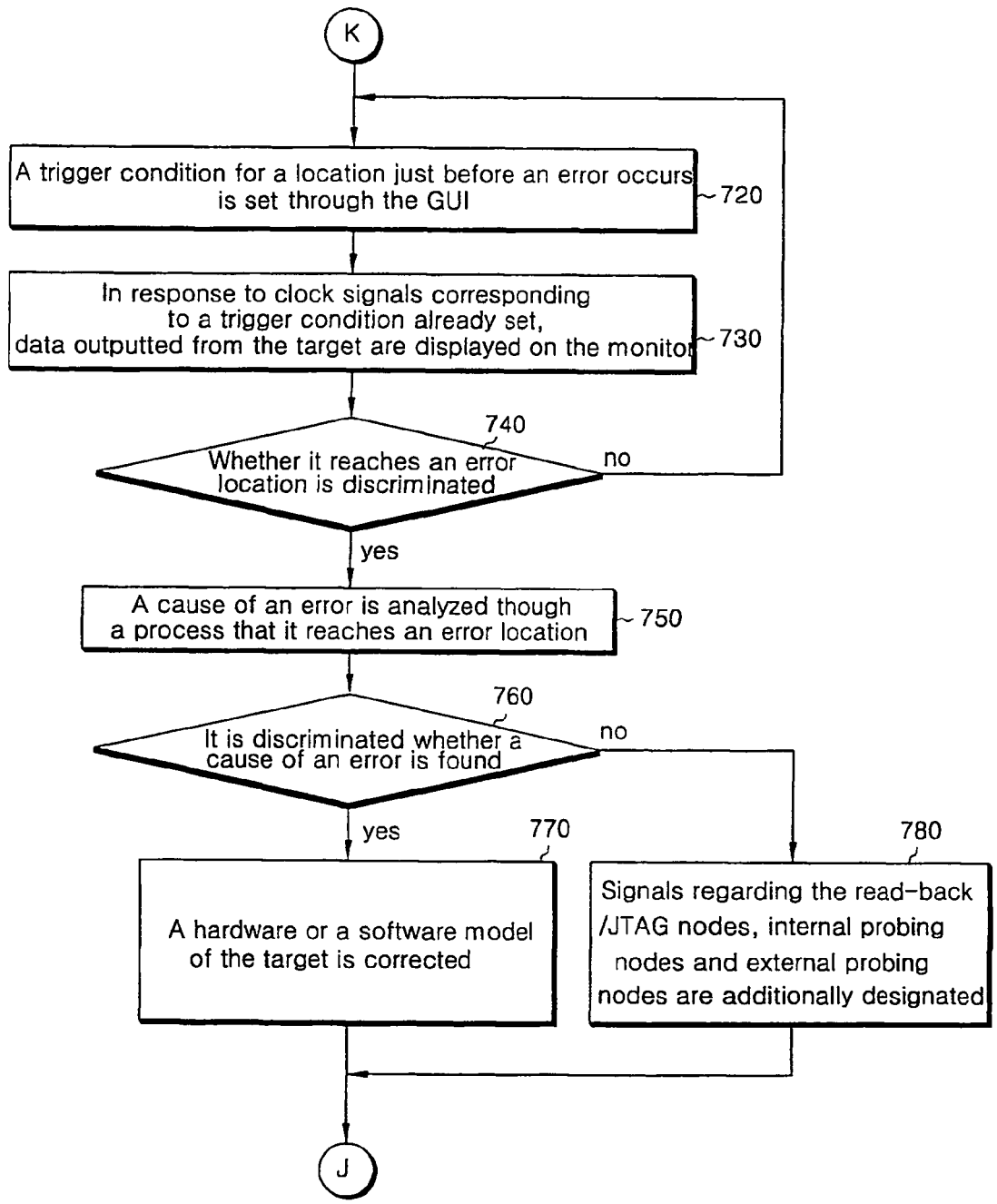

FIGS. 15a to 15c are flow charts illustrating an operation to verify the target using the chip design verifying and chip testing apparatus according to the preferred embodiment of the present invention. A debugging is performed after performing the target matching process of FIG. 14 or after looking over an operation of the target through this process.

The steps 600 to 620 are the same as the steps 300 to 320 of FIG. 14, and their explanation is omitted.

After performing the step 620, an input file inputted to input pins of the target 34 and an output file outputted from output pins of the target 34 are designated (step 630) through the GUI.

Storage and display start condition of the output file are designated through the GUI (step 640).

The input file is applied in a frame unit through the interface means 32 to the target 34, and an output of the target 34 is displayed on a window to verify an operation of each of components of the target 34 according to various designated conditions(step 650).

It is discriminated whether the trigger condition is set and matched (step 660).

When the trigger condition is not matched, it is discriminated whether an operation result of each component is satisfactory (step 670).

Alternately, if an operation result of each component is satisfactory, it is discriminated whether the last frame is transferred (step 680). When the last frame is transferred, an operation is finished, and when the last frame is not included, an operation turns to the step 650.

Also, if the trigger condition is matched, an operation of the target 34 is stopped at a trigger location to display the trigger location on a window (step 700).

If an operation result of each component is not satisfactory, a software trigger condition is set at a location adjacent to an abnormal operation on a window where an operation is not good or on a window where it is discriminated that there is a mutual relation, or a hardware trigger condition is set by changing the operation mode of the neighboring interface board to the logic analyzer mode (step 690).

The steps 710 to 780 are the same as the steps 430 to 500, and thus their explanation is omitted. In the flow chart of FIGS. 14 and 15, an operation between the GUI environment and the interface means 32 is explained in FIG. 7 and thus omitted. The chip design verifying and chip testing apparatus receives or outputs data continuously during a data transmission among the main memory 18, the interface means 32 and the target 34 in the verification mode.

Figure 16A:
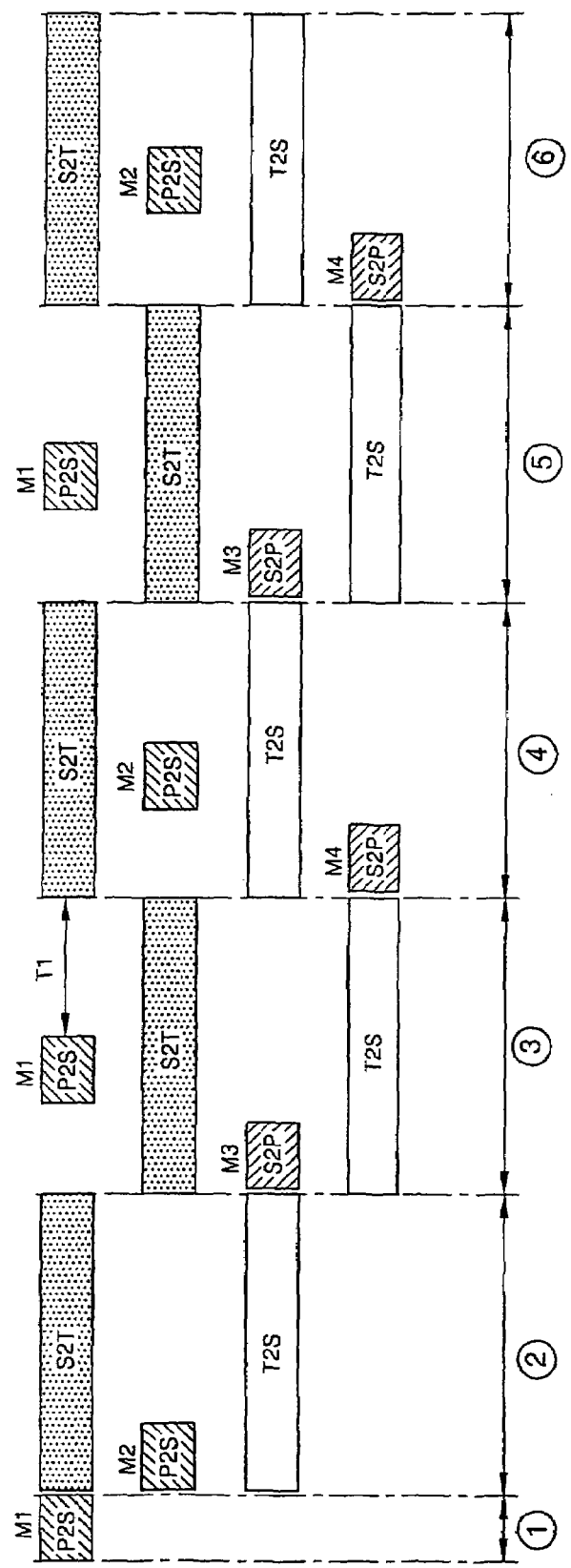
FIG. 16a shows a data transmission method when a data transmission speed of from the interface means to the target are equal to a data transmission speed of from the target to the interface means.
Figure 16B:
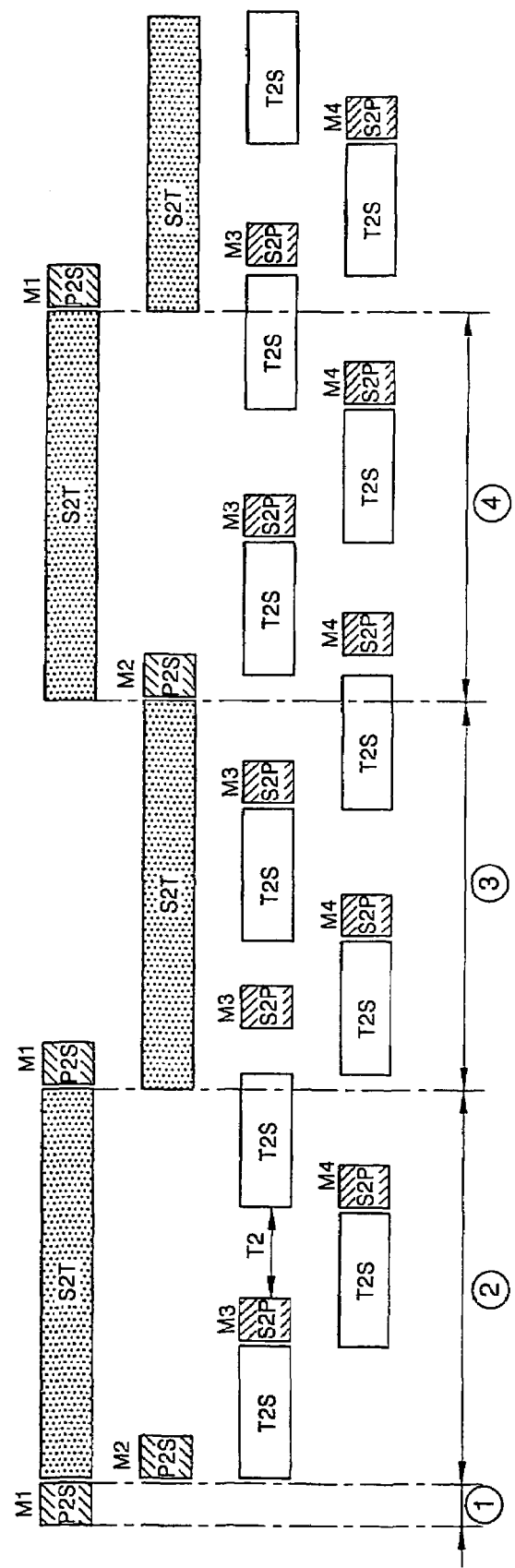
FIG. 16b shows a data transmission method when a data transmission speed of from the target to the interface means is faster than that of from the interface means to the target.
Figure 16C:
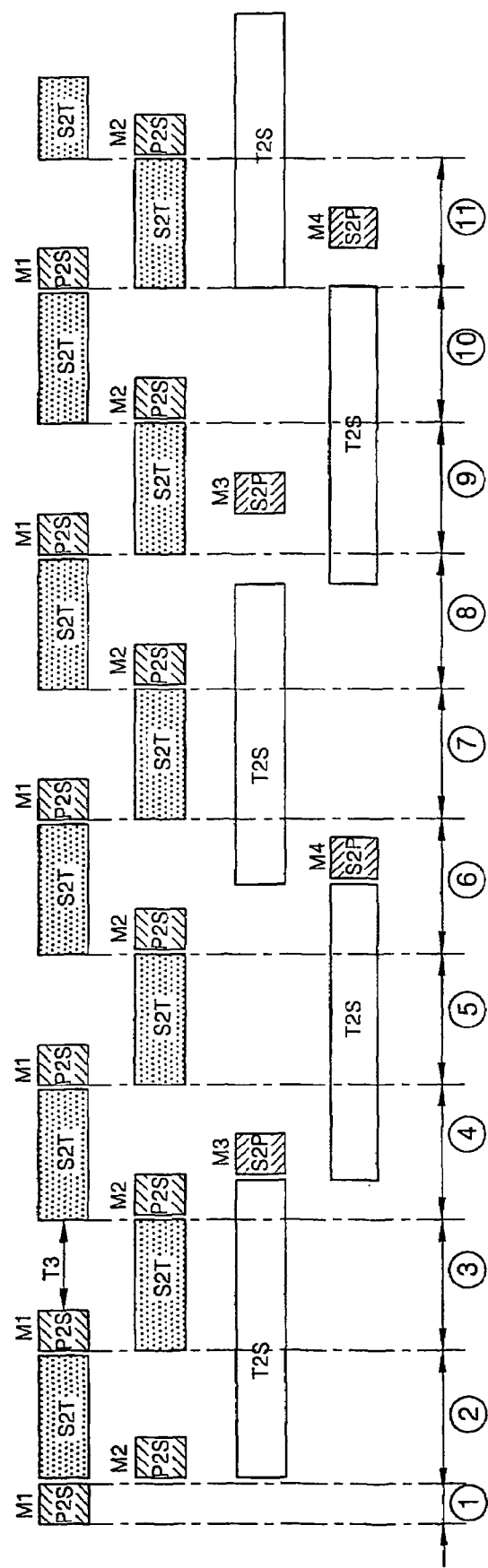
FIG. 16c shows a data transmission method when a data transmission speed of from the target to the interface means is slower than that of from the interface means to the target.

FIGS. 16a to 16c are views illustrating a data transmission method among the main memory 18, the interface means 32 and the target 34 of the inventive chip design verifying and chip testing apparatus, and particularly a data transmission method when the interface means 32 is designated for signal application and storage.

Of four memories M1 to M4 of the interface means 32, two memories M1 and M2 are used to store data applied from the main memory 18 to the interface means 32, and the rest two memories M3 and M4 are used to store data from the target 34 to the interface means 32.

In the data transmission method of FIGS. 16a to 16c, when a test vector stored in the hard disk 22 is selected through the GUI menu items and data compression items are designated, the test vector stored in the hard disk 22 is compressed by a software program to be stored in the frame buffer of the main memory 18. The compressed data stored in the frame buffer region of the main memory 18 are alternately stored in the memories M1 and M2 of the interface means 32.

When data are transmitted from interface means 32 to the target 34, the compressed data stored in the memories M1 and M2 are alternately restored and then transmitted by the data compression/restoration controller 72 of the controller 42 of the interface means 32. Also, when data are transmitted from the target 34 to the interface means 32, the data from the target 34 are compressed by the data compression/restoration controller 72 of the controller 42 of the interface means and then stored alternatively in the memories M3 and M4. The data stored in the memories M3 and M4 are alternately transferred to the frame buffer region of the main memory 18, and compressed data stored in the frame buffer region are restored by a software program, e.g., a restoration program, and then stored in a chunk memory region of the main memory 18.

FIG. 16a shows a data transmission method when a data transmission speed of from the interface means 32 to the target 34 are equal to a data transmission speed of from the target 34 to the interface means 32.

In FIG. 16a, hatched data represent compressed data and include data P2S transmitted from the main memory 18 to the interface means 32 and data S2P transmitted from the interface means 32 to the main memory 18. Non-hatched or dotted data denote restored data and include data S2T transmitted from the interface means 32 to the target 34 and data T2S transmitted from the target 34 to the interface means 32. In the first interval ①, the compressed data transmitted from the main memory 18 to the interface means 32 are stored in the memory M1. In the second interval ②, the compressed data stored in the memory M1 of the interface means 32 are restored by the data compression/restoration controller 72 of the controller 42 of the interface means 32 and then transmitted to the target 34. At the same time, data from the target 34 are transmitted to the interface means 32, and the compressed data transmitted from the main memory 18 to the interface means 32 are stored in the memory M2. In the third interval ③, the compressed data stored in the memory M3 are transmitted to the main memory 18, and compressed data stored in the memory M2 are restored by the data compression/restoration controller 72 of the controller 40 of the interface means 32 and then transmitted to the target 34, and at the same time, data from the target 34 are transmitted to the interface means 32 so that the data are compressed by the data compression/restoration controller 72 of the controller 40 of the interface means 32 and then are stored in the memory M4. After the compressed data are transmitted from the interface means 32 to the main memory 18, the compressed data from the main memory 18 are transmitted to the memory M1 of the interface means 32. In the same method, in the fourth to sixth intervals ④, ⑤ and ⑥, data are "continuously" transmitted from the interface means 32 to the target 34 or from the target 34 to the interface means 32.

FIG. 16b shows a data transmission method when a data transmission speed of from the target 34 to the interface means 32 is faster than that of from the interface means 32 to the target 34.

In FIG. 16b, in the first interval ①, the compressed data transmitted from the main memory 18 to the interface means 32 are stored in the memory M1. In the second interval ②, the compressed data stored in the memory M1 of the interface means 32 are restored by the data compression/restoration controller 72 of the controller 42 of the interface means 32 and then transmitted to the target 34. At the same time, data from the target 34 are transmitted to the interface means 32. At this moment, data transmitted from the target 34 to the interface means 32 are compressed by the data compression/restoration controller 72 of the controller and then stored in the memory M3. Compressed data transmitted from the main memory 18 to the interface means 32 are stored in the memory M2. At the same time that a storage operation in the memory M3 are completed, the compressed data begins to be stored in the memory M4, and the compressed data stored in the memory M3 are transmitted to the main memory 18. At this moment, data transmitted to the interface means 32 are compressed by the data compression/restoration controller 72 and then stored in the memory M4, and at the same time, data transmitted to the interface means 32 are compressed by the data compression/restoration controller 72 and then stored in the memory M3. At this moment, the compressed data stored in the memory M4 are transmitted to the main memory 18. If the compressed data in the memory M1 are restored by the data compression/restoration controller 72 and then transmitted completely while a storage operation in the memory M3 are performed, data in the memory M2 are restored by the data compression/restoration controller 72 and begins to be applied to the target 34, and the memory M1 stores the compressed data transmitted from the main memory 18.

In the third and fourth intervals ③ and ④, a data transmission is performed by the method described above.

FIG. 16c shows a data transmission method when a data transmission speed of from the target 34 to the interface means 32 is slower than that of from the interface means 32 to the target 34. Explanation of FIGS. 16a and 16b will help an understanding for FIG. 16c.

The interface means 32 can continuously transmit data even when a data transmission speed of from the interface means 32 to the target 34 differs from that of from the target 34 to the interface means 32. In FIGS. 16a to 16c, T1, T2 and T3 denote a speed margin. An operation is performed by detecting a present address of a corresponding memory at a time when data are completely transmitted from the main memory 18 to the interface means 32 or at a time when data are completely transmitted from the interface means 32 to the main memory 18, and an optimum operable speed between the interface means 32 and the target 34 can be automatically controlled by the CPU 10 monitoring the speed margins T1, T2 and T3. That is, an operation speed can be controlled in such a way that the CPU 10 controls the clock controller 66 of the controller 42 in the interface means 32.

Figure 17A:
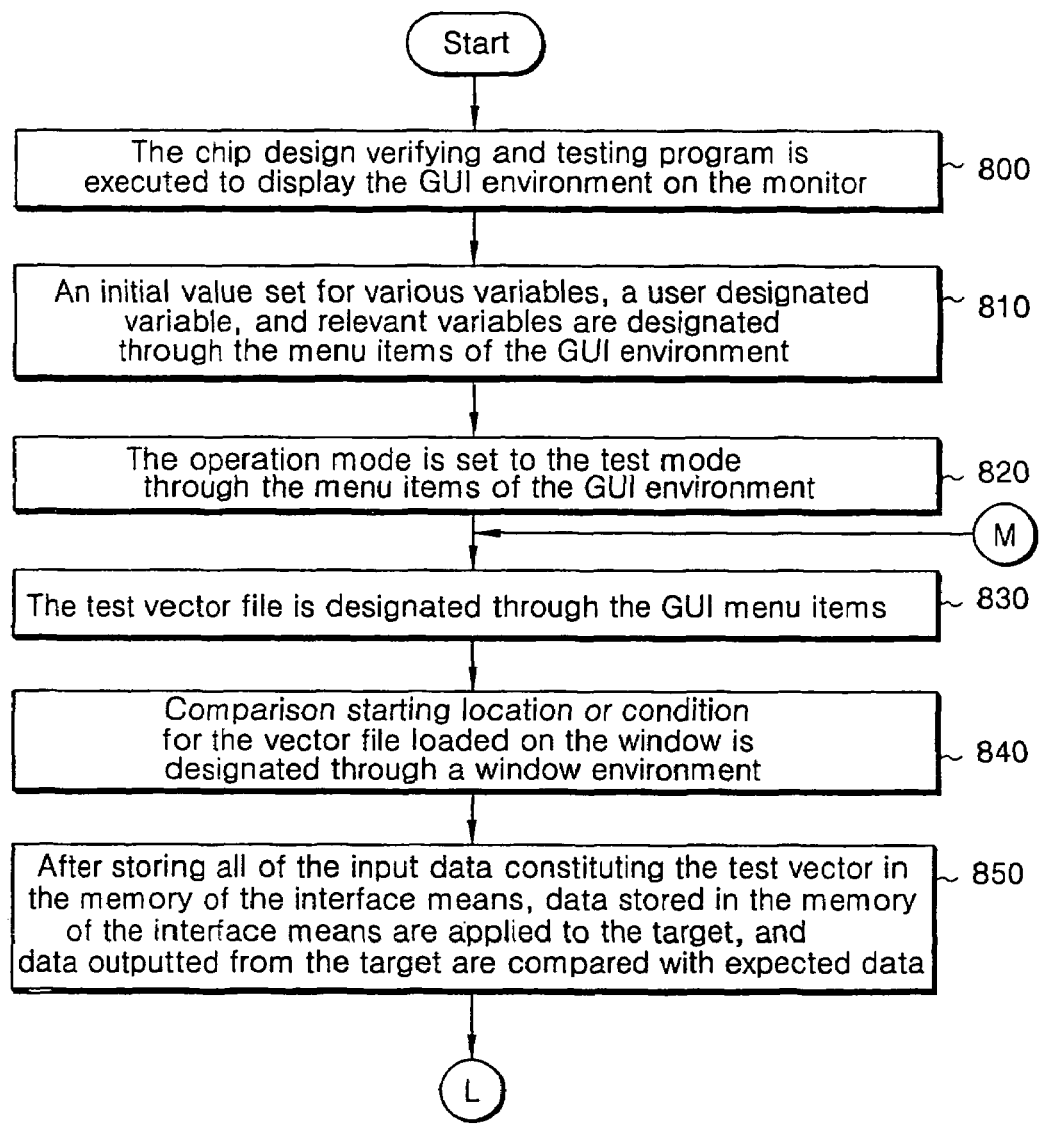
FIGS. 17a and 17b are a flow chart illustrating a chip design verifying and chip testing method according to the preferred embodiment of the present invention.
Figure 17B:
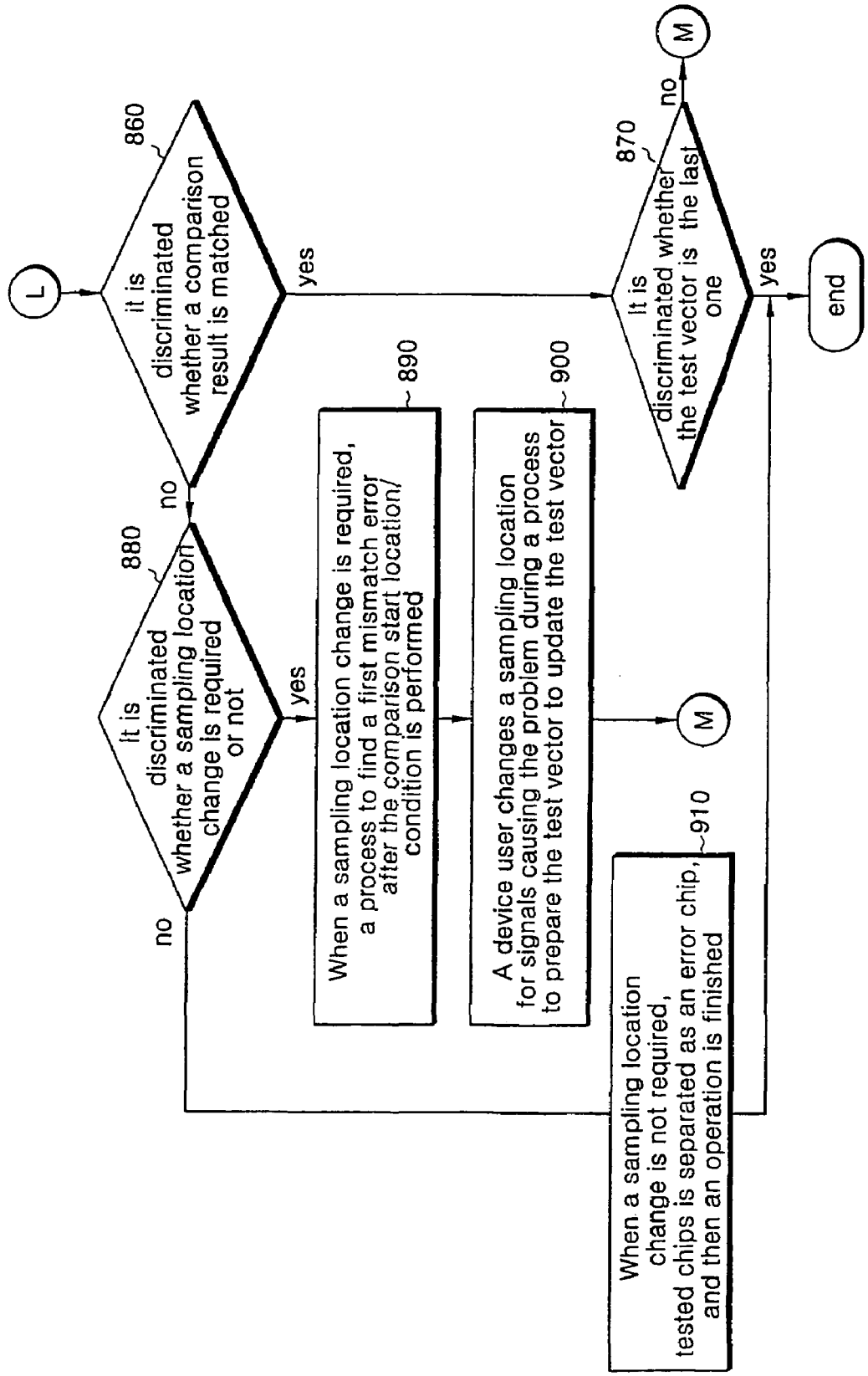

FIGS. 17a and 17b are a flow chart illustrating a chip testing method according to the preferred embodiment of the present invention and shows that the target 34 includes the hardware and software models embodied in the same method as that of FIG. 14. An operation of the steps 800 to 840 is equal to that of the steps 300 to 340 of FIG. 14. However, in the step 810, the frame buffer is designated to an initial value, according to a size of the test vector, a size of the frame buffer region of the main memory 18 and a size of the frame buffer region of the memory 40 of the interface means 32. When a size of the memory 40 of the interface means 32 is relatively small, either a memory board having the same memories as the memories M1 to M4 of the memory 40 of the interface means 32 or the memory 40 of the neighboring interface means 32 that is not being used may be connected to the first connector C1. In the step 820, an operation mode of the interface means 32 is set to the pattern generator and/or the logic analyzer.

After storing all of the input data constituting the test vector in the memory 40 of the interface means 32, data stored in the memory 40 of the interface means 32 are applied to the target 34, and data outputted from the target 34 are compared with expected data (step 850). That is, in case of testing a chip, after storing all of the input data constituting test vector in the memory of the interface means 32, data are transmitted between the interface means 32 and the target 34 at the same speed of an operation speed of the chip that is a target. Therefore, a test can be performed even when an operation speed of the chip is high.

Then, it is discriminated whether a comparison result is matched (step 860). When a comparison result is matched, it is discriminated whether the test vector is the last one. When the test vector is the last one, an operation is finished (step 870). However, when the test vector is not last one, an operation turns to the step 830. Also, when the comparison result is not matched, it is discriminated whether a sampling location change is required or not (step 880).

When a sampling location change is required, a process to find a first mismatch error after the comparison start location/condition is performed (step 890)

A device user changes a sampling location for signals causing the problem during a process to prepare the test vector to update the test vector and then an operation turns to the step 830 (step 900).

When a sampling location change is not required, tested chips is separated as an error chip, and then an operation is finished (step 910).

As described above, the chip design verifying and chip testing apparatus according to the preferred embodiment of the present invention uses the interface means to apply and store signals to continuously input the test vector file or the input data to the target through the interface means and to continuously receive data from the target through the interface means. Also, during a chip test operation, the interface means is set as the pattern generator and/or the logic analyzer, the test vector file is stored in the interface means, and data can be transmitted between the interface means and the target at a high speed.

As described herein before, the inventive chip design verifying and chip testing apparatus has the following advantages. Firstly, the inventive chip design verifying and chip testing apparatus can be used both as a chip design verifier to verify an operation of the designed chip and to debug an error, based on a computer system and as a chip tester to test an operation of the manufactured chip. Secondly, since data to be stored the memory of the interface means are compressed and transmitted, a data transmission speed and an apparatus performance can be improved. Thirdly, since the inventive chip design verifying and chip testing apparatus uses the GUI environment to display windows suitable for finding errors of blocks constituting a designed chip or a manufactured chip, error of corresponding blocks can be easily founded. Fourthly, since the inventive chip design verifying and chip testing apparatus can be constituted in a manner that an application program is installed in a computer, and the interface board is mounted in the PCI slots, the inventive chip design verifying and chip testing apparatus can be easily embodied. Fifthly, since the inventive chip design verifying and chip testing apparatus can set the interface means as a logic analyzer during an error debugging and display data outputted from a chip on a monitor according to the clock step number, a more precise debugging can be performed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A chip design verifying and chip testing apparatus, comprising:

a computer comprising:
a storing means for storing an application program, an I/O file, and a test vector, the application program being for verifying and testing operation of a designed chip and a manufactured chip which have a plurality of functional blocks;
an interface means controlling data transmission between the storing means and the chip; and
a CPU for executing and controlling the application program,
wherein, when the application program is executed, a graphic user interface is displayed on a monitor of the computer, and one of a verifying mode or a testing mode is set through the graphic user interface, and results corresponding to each of the plurality of the functional blocks are displayed through corresponding windows of a plurality of windows, wherein the interface manes includes:
a data applying means having first and second memories for storing the input file and/or the test vector outputted from the storing means and applying the stored result to the chip, the data applying means in the verifying mode alternately storing data dividing data constituting the input file stored in the storing means into a predetermined unit in the first and second memories and alternately applying the data stored in the first and second memories to the chip, and the data applying means in the testing mode storing all data constituting the test vector stored in the storing means in the first and second memories and applying the data stored in the first and second memories to the chip: a data storing means having third and fourth memories for storing data outputted from the chip, the data storing means in the verifying mode alternately storing the data applied from the chip in the third and fourth memories and alternately outputting the data stored in the third and fourth memories to the graphic user interface, and the data storing means in the testing mode storing the data applied from the chip in the third and fourth memories and outputting the data stored in the third and fourth memories to the graphic user interface; and a controlling means for controlling data transmission between the storing means and the data applying means, between the data applying means and the chip, between the chip and the data storing means, and between the data storing means and the storing means.

2. The apparatus of claim 1, wherein the application program compresses and stores the data constituting the input file and/or the test vector by means of a compression/restoration program when the data constituting the input file and/or the test vector are stored in the data applying means; and
restores the data stored in the storing means by means of the compression/restoration program when the data stored in the data storing means are transmitted to the graphic user interface.

3. The apparatus of claim 1, wherein the controlling means includes
a data compression/restoration means for restoring compressed data stored in the data applying means to transmit restored data to the chip, and for compressing data outputted from the chip to store compressed data in the data storing means.

4. The apparatus of claim 3, wherein the application program stores data constituting the input file and/or the test vector in the data applying means, compresses the data stored in the data applying means by the data compression/restoration means to store the compressed data in the data storing means by means the compression/restoration means, when the compressed data stored in the data storing means are transmitted.

5. The apparatus of claim 1, wherein the controlling means enables data transmission from the data applying means to the chip and data transmission from the chip to the data storing means to be continuously performed under a control of the CPU, in the verifying mode.

6. The apparatus of claim 1, wherein the controlling means controls an operation speed between the interface means and the chip in such a way that the CPU monitors data transmission speeds between the storing means and the interface means, between the data applying means, and the chip, between the chip and the data storing means, and between the data storing means and the storing means, in the verifying mode.

7. The apparatus of claim 1, wherein when it is determined that an error occurs in the chip in the verifying mode, the controlling means stops operation of the chip, finds a location where an error or a mismatch occurs for the first time and moves to the found location;
sets a condition corresponding to a neighboring location before the mismatch occurs as a trigger condition using the graphic interface; and
applies the data constituting the input file and/or the test vector to the chip and determines whether data outputted from the chip are consistent with the trigger condition be comparison therebetween.

8. The apparatus of claim 1, wherein when the data outputted from the chip are consistent with the trigger condition in the verifying mode, the controlling means sets the number of the steps of clocks using the graphic user interface, stores the data outputted from the chip in the data storing means as many as the set number of clock steps, and displays the stored data on the graphic user interface.

9. A chip design verifying and chip testing apparatus, comprising:
a computer including
a storing means storing an application program, an I/O file, and a test vector, the application program being for verifying and testing operation of a designed chip and a manufactured chip which have a plurality of functional blocks,
a CPU for executing and controlling the application program;
a main memory for loading the application program and the input file and/or the test vector stored in the storing means under a control of the CPU; and
an interface means for controlling data transmission between the main memory and the chip,
wherein when the application program is executed, a graphic user interface is displayed on a monitor of the computer, an operating mode of the chip is set, and the results obtained from performing operation according to the operating mode are displayed on a corresponding windows corresponding to each of the plurality of functional blocks; wherein the interface means includes:
a data applying means having first and second memories for storing the input file and/or the test vector outputted from the main memory and applying the stored result to the chip, the data applying means in the verifying mode alternately storing data dividing data constituting the input file stored in the storing means into a predetermined unit in the first and second memories and alternately applying the data stored in the first and second memories to the chip, and the data applying means in the testing mode storing all data constituting the test vector stored in the storing means in the first and second memories and applying the data stored in the first and second memories to the chip;

a data storing means having third and fourth memories for storing data outputted from the chip, the data storing means in the verifying mode alternately storing the data applied from the chip in the third and fourth memories and alternately outputting the data stored in the third and fourth memories to the graphic user interface, and the data storing means in the testing mode storing the data applied from the chip in the third and fourth memories and outputting the data stored in the third and fourth memories to the graphic user interface; and a controlling means for controlling data transmission between the main memory and the data applying means, between the data applying means and the chip, between the chip and the data storing means, and between the data storing means and the main memory.

10. The apparatus of claim 9, wherein the application program compresses and stores the data constituting the input file and/or the test vector by means of a compression/restorating program when the data constituting the input file and/or the test vector are stored in the data applying means; and restores the data stored in the data storing means by means of the compression/restoration program when the data stored in the data storing means are transmitted to the graphic user interface.

11. The apparatus of claim 10, wherein the application program stores data constituting the input file and the test vector in the data applying means, compresses the data stored in the data applying means by the data compression/restoration means to store the compressed data in the data storing means, and stores the compressed data stored in the data storing means in the storing means.

12. The apparatus of claim 9, wherein the controlling means includes:

a data compression/restoration means for restoring compressed data stored in the data applying means and transmitting restored data to the chip, and compressing data outputted from the chip and storing compressed data in the data storing means.

13. The apparatus of claim 9, wherein the controlling means enables data transmission of from the data applying means to the chip and data transmission from the chip to the data storing means to be continuously performed under a control of the CPU, in the verifying mode.

14. The apparatus of claim 9, wherein the controlling means:

controls operation speed between the interface means and the chip in such a way that the CPU monitors a data transmission speed between the main memory and the interface means, between the data applying means and the chip, between the chip and the data storing means, and between the data storing means and the chip and the main memory, in the verifying mode.

15. The apparatus of claim 9, wherein when it is determined that an error occurs in the chip in the verifying mode, the controlling means stops operation of the chip, finds a location where an error or a mismatch occurs for the first time and moves to the found location;

sets a condition corresponding to a neighboring location before the error or the mismatch occurs as a trigger condition using the graphic user interface; and applies the data constituting the input file and/or the test vector to the chip and determines whether data outputted from the chip are consistent with the trigger condition be comparison therebetween.

16. The apparatus of claim 15, further comprising a connection module for connecting each of the predetermined number of the interface blocks with the chip, wherein the connection module is mounted on a front surface of a mainframe of the computer.

17. The apparatus of claim 9, wherein each of the predetermined number of the interface blocks is configured in the form of a board and is inserted into slogs in the computer.

18. The apparatus of claim 9, wherein the computer includes:

a main board having a predetermined number of slots;

a connection board being connected to the slots and having a first connector; and a connection module including a back board and a housing, the back board having a second connector connected to the first connector of the connection board and a predetermined number of third connectors connected to the second connector, the housing having a first guide for accepting the predetermined number of the interface blocks connected to the predetermined number of the third connectors connected to the back board and a second guide for accepting a predetermined number of connection blocks connected to the predetermined number of the interface blocks.

19. The apparatus of claim 18, wherein the back board includes:

a computer power applying connector for applying an electrical power for the computer to the interface blocks;

a verification and test power supplying connector for supplying the electrical power for a verification and test to the interface blocks and the connection blocks during the verification and test; and a switching means for connecting the computer power supplying connector or the verification and test power supplying connector in response to a control signal applied from the interface means.

20. A chip design verifying and chip testing method, comprising:

a computer including a storing means for storing an application program, an input file, test vector, the application program being for verifying and testing operation of a designed chip and a manufactured chip which have a plurality of functional blocks;

the method comprising steps;

executing the application program to display a graphic user interface on a monitor of the computer;

when an operating mode is set to a verifying mode to verify an operation of the designed chip through the graphic user interface, storing alternately data constituting the input file stored in the storing means in a data applying means;

applying alternately data stored in the applying means to the chip;

storing alternately data outputted from the chip in the data storing means; and storing alternately data stored in the data storing means in the storing means, wherein an operation speed between the interface means and chip is controlled by monitoring data transmission speeds between the storing means and data applying means, between the data applying means and the chip, between the chip and the data storing means, and between the data storing means and the storing means so that a data transmission may be continuously performed, in the verifying mode, and when a operating mode of the interface mean is set to a test mode to test the manufactured chip through the graphic user interface, storing data constituting the test vector stored in the storing means in the data applying means; and storing data outputted from the chip in the data storing means while applying data constituting the test vector stored in the data applying means to the chip; and storing the data stored in the data storing means in the storing means.

21. The method of claim 20, further comprising, compressing and storing the input file and/or the test vector in the data applying means, and restoring and applying the data stored the data applying means when the input file and/or the test vector stored in the storing means is applied to the chip; and compressing and storing data outputted from the chip in the data storing means when data outputted from the chip are stored in the data storing means.

22. The method of claim 20, wherein data transmission from the data applying means to the chip and data transmission from the chip to the data storing means are continuously performed.

23. The method of claim 20, wherein when it is determined that an error occurs in the chip in the verifying mode, the controlling means stops operation of the chip, finds a location where an error or a mismatch occurs for the first time and moves to the found location;

sets a condition corresponding to neighboring location before the error or the mismatch occurs as a trigger condition using the graphic user interface; and applies the data constituting the input file and/or the test vector to the chip and determines whether data outputted from the chip are consistent with the trigger condition be comparison therebetween.

24. The method of claim 23, when the data outputted from the chip are consistent with the trigger condition in the verifying mode, the controlling means sets the number of steps of clocks using the graphic user interface, stores the data outputted from the chip in the data storing means as many as the set number of clock steps, and displays the stored data on the graphic user interface.

* * * * *